United States Patent
Lee et al.

(10) Patent No.: US 11,854,445 B2
(45) Date of Patent: Dec. 26, 2023

(54) METHOD FOR INSPECTING DISPLAY DEVICE AND METHOD FOR FABRICATING DISPLAY DEVICE

(71) Applicant: Samsung Display Co., LTD., Yongin-si (KR)

(72) Inventors: Hyung Jin Lee, Suwon-si (KR); Sang Heon Ye, Cheonan-si (KR); Se Yoon Oh, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 227 days.

(21) Appl. No.: 17/166,445

(22) Filed: Feb. 3, 2021

(65) Prior Publication Data

US 2021/0366329 A1 Nov. 25, 2021

(30) Foreign Application Priority Data

May 19, 2020 (KR) .................. 10-2020-0059651

(51) Int. Cl.
| | |
|---|---|
| *G09G 3/00* | (2006.01) |
| *H01L 51/56* | (2006.01) |
| *G01N 21/956* | (2006.01) |
| *G01N 21/88* | (2006.01) |
| *H10K 71/00* | (2023.01) |

(52) U.S. Cl.
CPC ......... *G09G 3/006* (2013.01); *G01N 21/8851* (2013.01); *G01N 21/95607* (2013.01); *H10K 71/00* (2023.02)

(58) Field of Classification Search
None
See application file for complete search history.

(56) References Cited

U.S. PATENT DOCUMENTS

| | | | |
|---|---|---|---|
| 9,514,682 B2 * | 12/2016 | Yang | G09G 3/3291 |
| 10,026,351 B2 * | 7/2018 | Kim | G09G 3/2055 |
| 2019/0081116 A1 * | 3/2019 | Kondo | H01L 27/3218 |

FOREIGN PATENT DOCUMENTS

| | | |
|---|---|---|
| KR | 10-2009-0116553 | 11/2009 |
| KR | 10-0927429 | 11/2009 |
| KR | 10-1603617 | 3/2016 |
| KR | 10-1702887 | 2/2017 |
| KR | 10-2019-0088930 | 7/2019 |

* cited by examiner

*Primary Examiner* — Patrick Assouad
*Assistant Examiner* — Haidong Zhang
(74) *Attorney, Agent, or Firm* — KILE PARK REED & HOUTTEMAN PLLC

(57) ABSTRACT

A method for inspecting a display device includes preparing a target substrate comprising sub-pixels in which light-emitting elements are disposed, dividing each of first regions of the sub-pixels into second regions, obtaining a gray value of each of the second regions, generating a random number using the gray value, calculating a representative value of each of the first regions by reflecting variables in the random number, and summing the representative values of the first regions to calculate a number of light-emitting elements of the sub-pixels.

19 Claims, 18 Drawing Sheets

550: 551, 552, 553, 558

FIG. 12
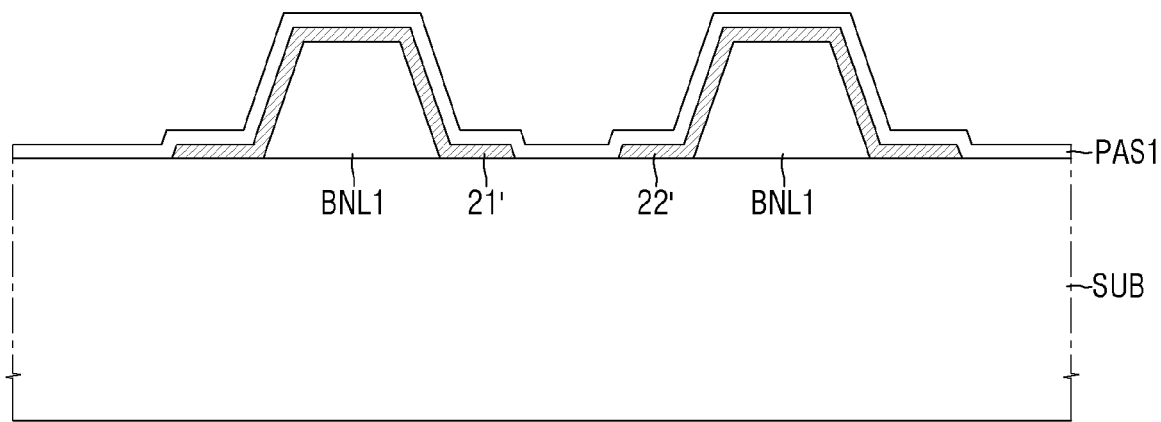
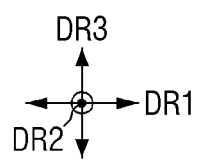

METHOD FOR INSPECTING DISPLAY DEVICE AND METHOD FOR FABRICATING DISPLAY DEVICE

CROSS REFERENCE TO RELATED APPLICATION(S)

This application claims priority to and benefits of Korean Patent Application No. 10-2020-0059651 under 35 USC § 119, filed in the Korean Intellectual Property Office on May 19, 2020, the entire contents of which are herein incorporated by reference.

BACKGROUND

1. Technical Field

The disclosure relates to a method for inspecting a display device and a method for fabricating a display device.

2. Description of the Related Art

Display devices become more and more important as multimedia technology evolves. Accordingly, a variety of types of display devices such as organic light-emitting display (OLED) devices and liquid-crystal display (LCD) devices are currently used.

Display devices are for displaying images and may include a display panel such as an organic light-emitting display panel or a liquid-crystal display panel. Among them, a light-emitting display panel may include light-emitting elements. For example, light-emitting diodes (LEDs) may include an organic light-emitting diode (OLED) using an organic material as a fluorescent material, and an inorganic light-emitting diode using an inorganic material as a fluorescent material.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure may provide a method for inspecting a display device by which the number of light-emitting elements disposed in sub-pixels can be checked.

Aspects of the disclosure may provide a method for inspecting a display device that can reduce a process tact time.

Aspects of the disclosure may also provide a method for fabricating a display device using the method for inspecting the display device.

It should be noted that aspects of the disclosure are not limited to the above-mentioned aspects; and other aspects of the invention will be apparent to those skilled in the art from the following descriptions.

According to embodiments of the disclosure, it may be possible to reduce a process tact time by calculating the number of light-emitting elements by calculating the representative values based on the images on a substrate.

It should be noted that effects of the disclosure are not limited to those described above and other effects of the disclosure will be apparent to those skilled in the art from the following descriptions.

According to an embodiment of the disclosure, a method for inspecting a display device may include preparing a target substrate comprising sub-pixels in which light-emitting elements are disposed, dividing each of a plurality of first regions of the sub-pixels into a plurality of second regions, obtaining a gray value of each of the plurality of second regions, generating a random number using the gray value, calculating a representative value of each of the plurality of first regions by reflecting variables in the random number, and summing the representative values of the plurality of first regions to calculate a number of light-emitting elements of the sub-pixels.

In an embodiment, the obtaining of the gray value may include obtaining images by scanning an entire area of the target substrate using an inspection apparatus comprising a sensing part.

In an embodiment, the entire area of the target substrate may be converted into a single image by template matching.

In an embodiment, the generating of the random number may include generating the random number using a Monte-carlo simulation of a minimum value and a maximum value of the gray value of each of the plurality of second regions.

In an embodiment, the random number may be a value between the minimum value and the maximum value that may be selected randomly.

In an embodiment, the variables may be at least one of a gray value, a micro X value, a micro Y value, a global X value, and a global Y value.

In an embodiment, the micro X value may be a x-coordinate of a location of the first region in the respective sub-pixel where the gray value may be obtained, and the micro Y value may be a y-coordinate of the location of the first region in the respective sub-pixel where the gray value may be obtained.

In an embodiment, the global X value may be a x-coordinate of a location of the first region in the target substrate where the gray value may be obtained, and the global Y value may be a y-coordinate of the location of the first region in the target substrate where the gray value may be obtained.

In an embodiment, the gray value, the micro X value and the global X value may decrease a value of the random number, and the micro Y value and the global Y value may increase the value of the random number.

In an embodiment, the representative value of each of the plurality of first regions may be associated with a respective number of light-emitting elements.

In an embodiment, the number of light-emitting elements disposed in the plurality of first regions of the sub-pixels may be calculated by summing the representative values of the respective first regions.

In an embodiment, the gray value of each of the plurality of second regions may be obtained by measuring the target substrate using an inspection apparatus equipped with a sensor device.

In an embodiment, the sensor device may be a time delay integration TDI scan camera.

In an embodiment, the method may further include comparing the number of the light-emitting elements of the sub-pixels with a reference value, and determining a condition of the target substrate based on a result of the comparing.

According to an embodiment of the disclosure, a method for fabricating a display device may include disposing light-emitting elements on a target substrate comprising sub-pixels, scanning the target substrate with an inspection apparatus comprising a sensor part to obtain images, dividing each of a plurality of first regions of the sub-pixels into a plurality of second regions, obtaining a gray value of each of the plurality of second regions, generating a random number using the gray value, calculating a representative value for each of the plurality of first regions by reflecting variables in the random number, calculating a number of the light-emitting elements of the sub-pixels by summing representative values of the plurality of first regions, determining a condition of the target substrate based on the number of light-emitting elements of the sub-pixels, forming a first insulating layer on the target substrate, and forming a first contact electrode and a second contact electrode in contact with the light-emitting elements.

In an embodiment, the disposing of the light-emitting elements may include forming a first electrode layer and a second electrode layer on the target substrate, spraying an ink containing the light-emitting elements dispersed in a solvent onto the target substrate, and generating an electric field over the target substrate to align the light-emitting elements.

In an embodiment, the scanning of the target substrate may include inspecting the target substrate after the spraying of the ink, wherein the inspection apparatus may be disposed at an end of an inkjet printing apparatus.

In an embodiment, the inspection apparatus may include rails to which the sensing part is coupled, and the sensing part may reciprocate through the rails to scan the target substrate.

In an embodiment, the generating of the random number may include generating the random number using a Montecarlo simulation of a minimum value and a maximum value of the gray value of each of the plurality of second regions, and the random number may be a value between the minimum value and the maximum value that may be selected randomly.

In an embodiment, the variables may be a gray value, a micro X value, a micro Y value, a global X value and a global Y value, the gray value, the micro X value and the global X value may decrease a value of the random number, and the micro Y value and the global Y value may increase the value of the random number.

BRIEF DESCRIPTION OF THE DRAWINGS

The above and other aspects and features of the disclosure will become more apparent by describing in detail embodiments thereof with reference to the attached drawings, in which:

FIG. 12 is a schematic cross-sectional view showing a part of processing steps of fabricating a display device according to an embodiment of the disclosure.

DETAILED DESCRIPTION OF THE EMBODIMENTS

Figure 1:
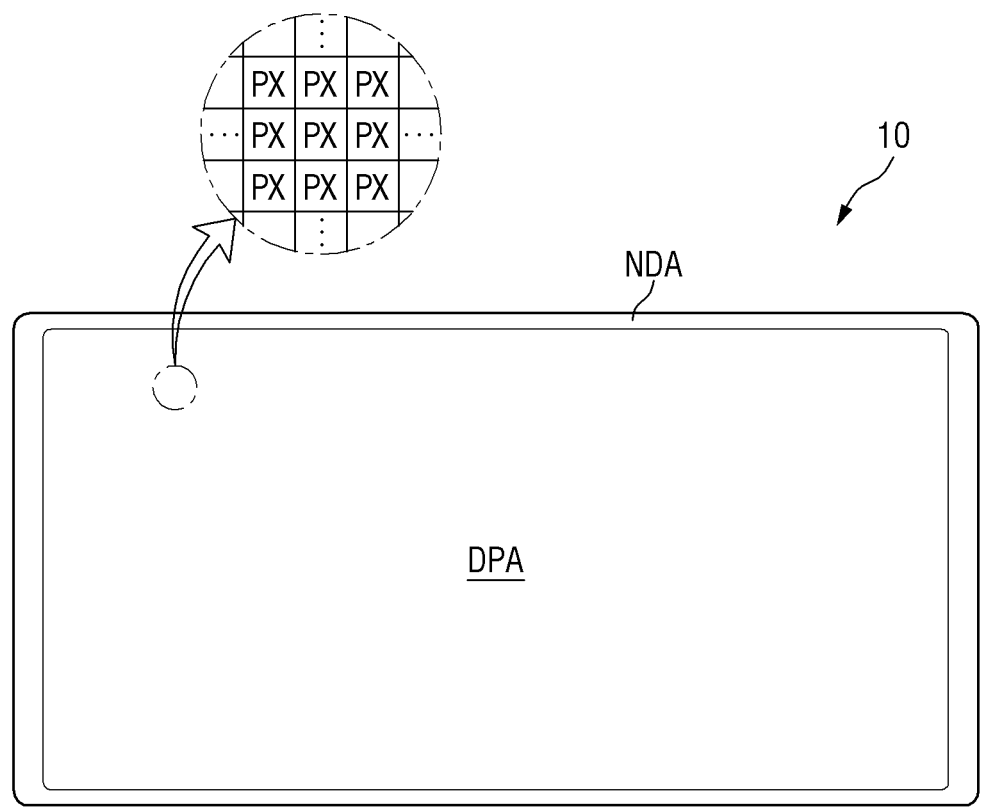
FIG. 1 is a schematic plan view of a display device according to an embodiment of the disclosure.

The invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

The same reference numbers indicate the same components throughout the specification.

Use of the singular form (e.g., "a" "an", "the") may include plural forms as well, unless the context clearly indicates otherwise. The term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Terms such as "comprising", "including" and "having" are intended to indicate the existence of the elements disclosed in the disclosure, and are not intended to preclude the possibility that one or more other elements may exist or may be added.

It will also be understood that when a layer is referred to as being "on" another layer or substrate, it can be directly on the other layer or substrate, or intervening layers may also be present.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the invention. Similarly, the second element could also be termed the first element.

Each of the features of the various embodiments of the disclosure may be combined, in part or in whole, and technically various interlocking and driving are possible. Each embodiment may be implemented independently of each other or may be implemented together in an association.

The term "overlap" may include layer, stack, face or facing, extending over, extending under, covering or partly covering or any other suitable term as would be appreciated and understood by those of ordinary skill in the art. The expression "not overlap" may include apart from or set aside from or offset from and any other suitable equivalents as would be appreciated and understood by those of ordinary skill in the art.

In the specification and the claims, the phrase "at least one of" is intended to include the meaning of "at least one selected from the group of" for the purpose of its meaning and interpretation. For example, "at least one of A and B" may be understood to mean "A, B, or A and B."

When an element is referred to as being "in contact" or "contacted" or the like to another element, the element may be in "electrical contact" or in "physical contact" with another element; or in "indirect contact" or in "direct contact" with another element.

"About" or "approximately" or "substantially" as used herein may be inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within, for example, ±30%, 20%, or 5% of the stated value.

Unless otherwise defined or implied, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the description.

FIG. 1 is a schematic plan view of a display device according to an embodiment of the disclosure.

Referring to FIG. 1, the display device 10 may display a moving image or a still image. The display device 10 may refer to any electronic device that provides a display screen. For example, the display device 10 may include a television set, a laptop computer, a monitor, an electronic billboard, an Internet of Things device, a mobile phone, a smart phone, a tablet personal computer (PC), an electronic watch, a smart watch, a watch phone, a head-mounted display device, a mobile communications terminal, an electronic notebook, an electronic book, a portable multimedia player (PMP), a navigation device, a game console, a digital camera, a camcorder, or the like.

The display device 10 may include a display panel for providing a display screen. Examples of the display panel may include an inorganic light-emitting diode display panel, an organic light-emitting display panel, a quantum-dot light-emitting display panel, a plasma display panel, a field emission display panel, or the like. In the following description, an inorganic light-emitting diode display panel may be employed as an example of the display panel 10, but the disclosure is not limited thereto. Any other display panel may be employed as long as the technical idea of the disclosure can be equally applied.

The shape of the display device 10 may be modified in a variety of ways. For example, the display device 10 may have shapes such as a rectangle with longer lateral sides, a rectangle with longer vertical sides, a square, a quadrangle with rounded corners (vertices), other polygons, a circle, or other appropriate shapes. The shape of a display area DPA of the display device 10 may also be similar to the overall shape of the display device 10. FIG. 1 shows the display device 10 in the shape of a rectangle with longer horizontal sides and the display area DPA.

The display device 10 may include the display area DA and a non-display area NDA. In the display area DPA, images can be displayed. In the non-display areas NDA, images may not be displayed. The display area DPA may be referred to as an active area, while the non-display areas NDA may also be referred to as an inactive area. The display area DPA may generally occupy the center of the display device 10.

The display area DPA may include pixels PX. The pixels PX may be arranged in a matrix. The shape of each pixel PX may be, but is not limited to, a rectangle or a square when viewed from the top. Each pixel may have a diamond shape having sides inclined with respect to a direction. The stripe-type pixels PX and Pentile®-type pixels may be arranged alternately. Each of the pixels PX may include at least one light-emitting element that emits light of a particular wavelength band to represent a color.

The non-display areas NDA may be disposed around the display area DPA. The non-display areas NDA may surround the display area DPA entirely or partially. The display area DPA may have a rectangular shape, and the non-display areas NDA may be disposed to be adjacent to the four sides of the display area DPA. The non-display area NDA may form the bezel of the display device 10. Lines or circuit drivers included in the display device 10 may be disposed in each of the non-display areas NDA, or external devices may be mounted.

Figure 2:
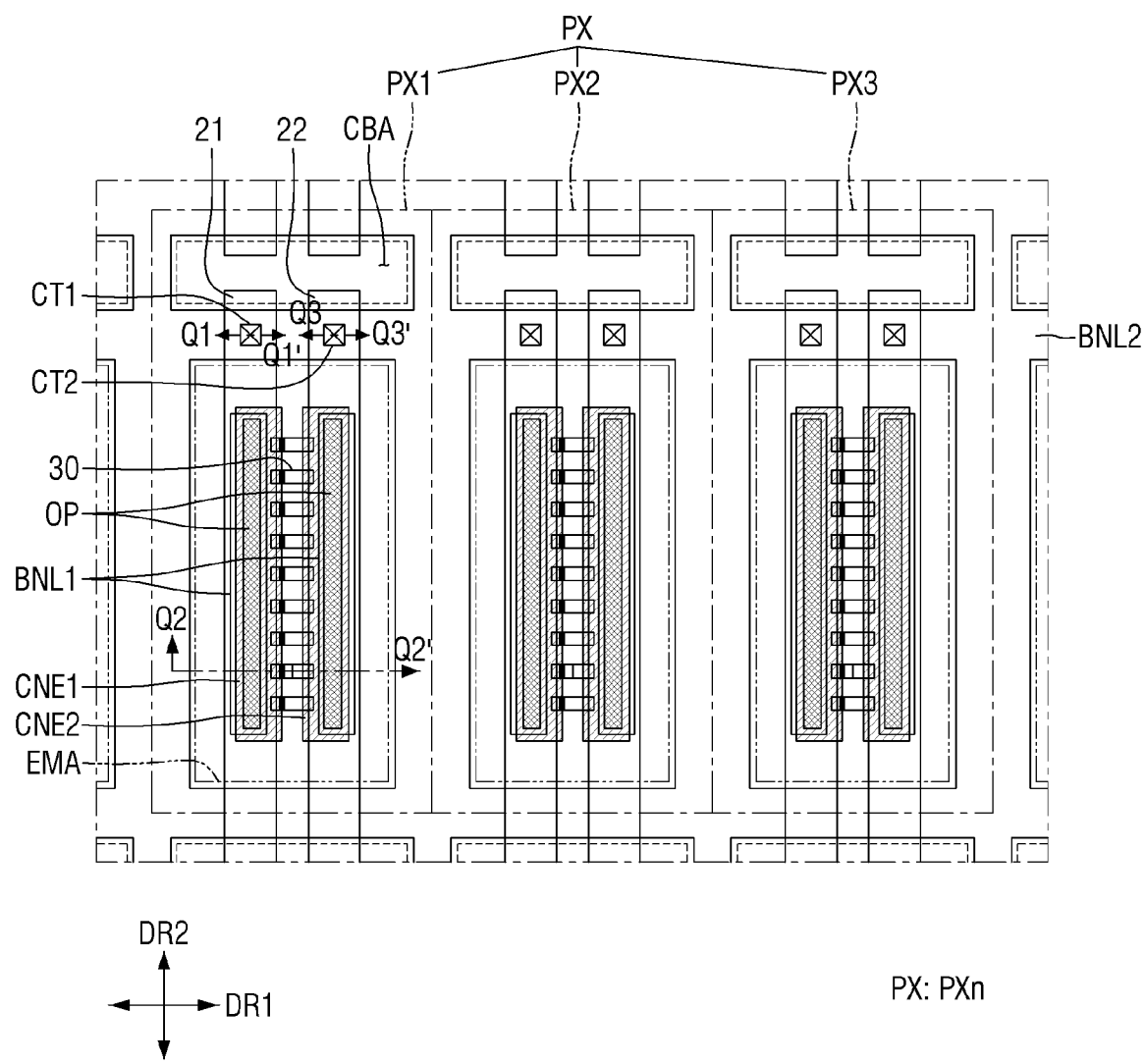
FIG. 2 is a schematic plan view showing a pixel of a display device according to an embodiment of the disclosure.

FIG. 2 is a schematic plan view showing a pixel of a display device according to an embodiment of the disclosure.

Referring to FIG. 2, each of the pixels PX may include sub-pixels PXn, where n may be an integer from one to three. For example, a pixel PX may include a first sub-pixel PX1, a second sub-pixel PX2 and a third sub-pixel PX3. The first sub-pixel PX1 may emit light of a first color, the second sub-pixel PX2 may emit light of a second color, and the third sub-pixel PX3 may emit light of a third color. For example, the first color may be blue, the second color may be green, and the third color may be red. It is, however, to be understood that the disclosure is not limited thereto. All the sub-pixels PXn may emit light of the same color. Although the pixel PX includes three sub-pixels PXn in the example shown in FIG. 2, the disclosure is not limited thereto. The pixel PX may include more than two sub-pixels PXn.

Each of the sub-pixels PXn of the display device 10 may include an emission area EMA and a non-emission area (not shown). In the emission area EMA, the light-emitting elements 30 may be disposed to emit light of a particular wavelength. In the non-emission area, no light-emitting element 30 may be disposed and light emitted from the light-emitting elements 30 may not reach and thus no light exits therefrom. The emission area EMA may include an area in which the light-emitting elements 30 may be disposed, and may include an area adjacent to the light-emitting elements 30 where lights emitted from the light-emitting element 30 exit.

It is, however, to be understood that the disclosure is not limited thereto. The emission area EMA may also include an area in which light emitted from the light-emitting element 30 may be reflected or refracted by other elements to exit. The light-emitting elements 30 may be disposed in each of the sub-pixels PXn, and the emission area may include the area where the light-emitting elements may be disposed and the adjacent area.

In the emission area EMA, contact electrodes CNE1 and CNE2 may be disposed, which may overlap the electrodes 21 and 22, respectively, and may be in contact with a side and another side of the light-emitting elements 30, respectively. The contact electrodes CNE1 and CNE2 may be electrically connected to the electrodes 21 and 22, respectively, through openings OP. The structures of the electrodes 21 and 22 and the contact electrodes CNE1 and CNE2 will be described in detail later.

Each of the sub-pixels PXn may further include a cut area CBA disposed in the non-emission area. The cut area CBA may be disposed on one side of the emission area EMA in the second direction DR2. The cut area CBA may be disposed between the emission areas EMA of neighboring sub-pixels PXn in the second direction DR2. In the display area DPA of the display device 10, emission areas EMA and cutout areas CBA may be arranged. For example, the emission areas EMA and the cutout areas CBA may be arranged repeatedly in the first direction DR1, and may be arranged alternately in the second direction DR2. The spacing between the cutout areas CBA in the first direction DR1 may be smaller than the spacing between the emission areas EMA in the first direction DR1. A second bank BNL2 may be disposed between the cutout regions CBA and the emission areas EMA, and the distance between them may vary depending on the width of the second bank BNL2. Although the light-emitting elements 30 may not be disposed in the cutout areas CBA and thus no light may exit therefrom, parts of the electrodes 21 and 22 disposed in each of the sub-pixels PXn may be disposed there. The electrodes 21 and 22 disposed for each of the sub-pixels PXn may be disposed separately from each other in the cut area CBA.

Figure 3:
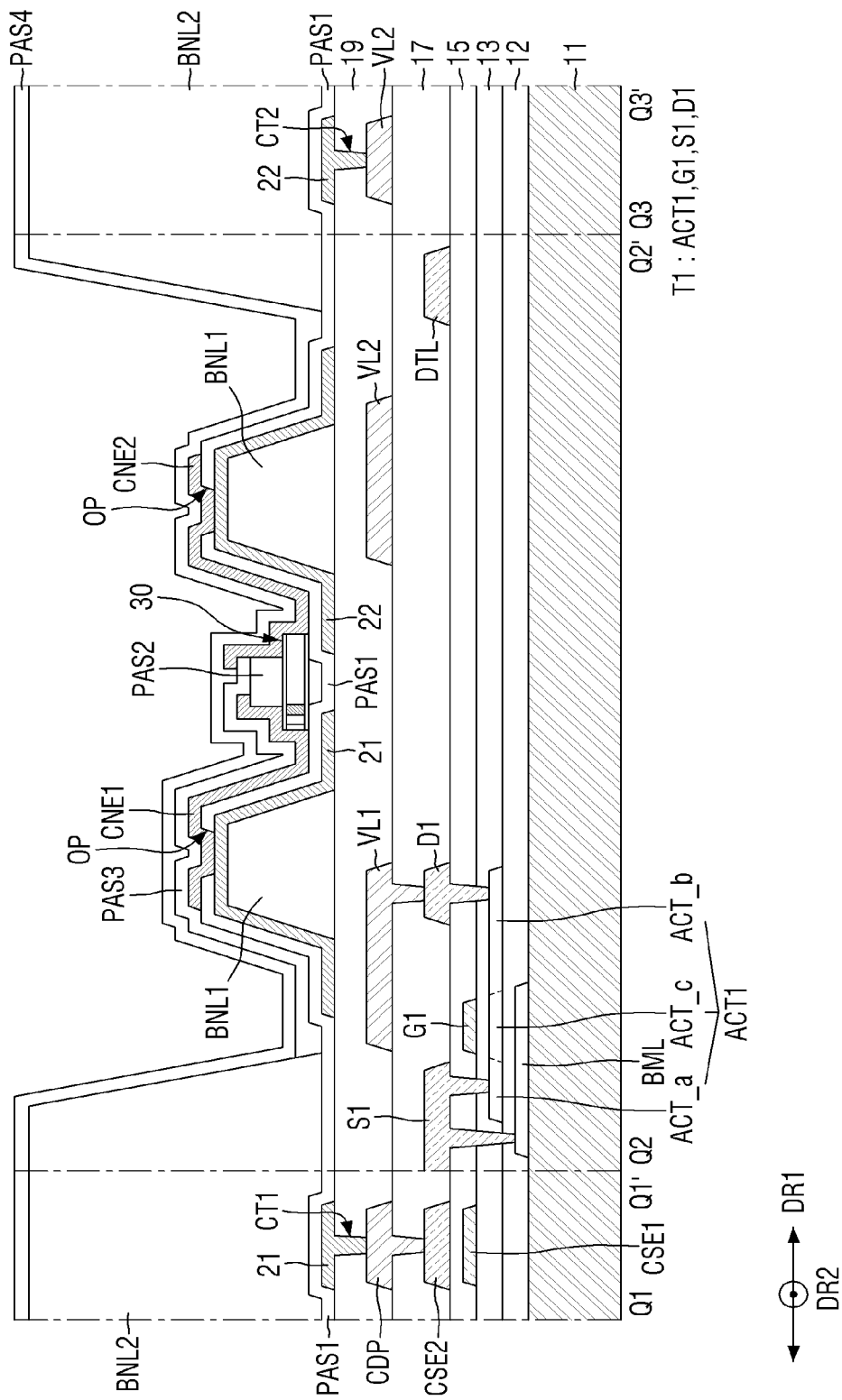
FIG. 3 is a schematic cross-sectional view taken along lines Q1-Q1', Q2-Q2' and Q3-Q3' of FIG. 2.

FIG. 3 is a schematic cross-sectional view taken along lines Q1-Q1', Q2-Q2' and Q3-Q3' of FIG. 2. FIG. 3 is a view showing a cross section from an end to another end of the light-emitting element 30 disposed in the first sub-pixel PX1 of FIG. 2.

Referring to FIG. 3 in conjunction with FIG. 2, the display device 10 may include a substrate 11, a semiconductor layer disposed on the substrate 11, conductive layers, and insulating layers. The semiconductor layer, the conductive layer and the insulating layers may form a circuit layer and an emission material layer of the display device 10.

Specifically, the substrate 11 may be an insulating substrate. The substrate 11 may be formed of an insulating material such as glass, quartz, a polymer resin, or a combination thereof. The substrate 11 may be either a rigid substrate or a flexible substrate that can be bent, folded, or rolled.

A light-blocking layer BML may be disposed on the substrate 11. The light-blocking layer BML may overlap an active layer ACT1 of a first transistor T1 of the display device 10. The light-blocking layer BML1 may include a material that blocks light, and thus can prevent light from entering the active layer ACT1 of the first transistor T1. For example, the light-blocking layer BML may be formed of an opaque metal material that blocks light transmission. It is, however, to be understood that the disclosure is not limited thereto. In some implementations, the light-blocking layer BML may be eliminated.

A buffer layer 12 may be disposed entirely on the substrate 11, including the light-blocking layer BML. The buffer layer 12 may be formed on the substrate 11 to protect the first thin-film transistors T1 of the pixels PX from moisture permeating through the substrate 11 that may be susceptible to moisture permeation, to provide a flat surface. The buffer layer 12 may be formed of inorganic layers stacked on one another alternately. For example, the buffer layer 12 may be formed of multiple layers in which inorganic layers including at least one of a silicon oxide (SiOx), a silicon nitride (SiNx) and silicon oxynitride (SiON) may be stacked on one another alternately.

The semiconductor layer may be disposed on the buffer layer 12. The semiconductor layer may include the active layer ACT1 of the first transistor T1. These may be disposed to partially overlap a gate electrode G1 of a first gate conductive layer, etc., which will be described later.

Although only the first transistor T1 among the transistors included in the sub-pixels PXn of the display device 10 is depicted in the drawing, the disclosure is not limited thereto. The display device 10 may include a larger number of transistors. For example, the display device 10 may include more than one transistors in addition to the first transistor T1, i.e., two or three transistors in each of the sub-pixels PXn.

The semiconductor layer may include polycrystalline silicon, monocrystalline silicon, an oxide semiconductor, etc., or a combination thereof. In case that the semiconductor layer includes an oxide semiconductor, each active layer ACT1 may include conductive regions ACT_a and ACT_b and a channel region ACT_c therebetween. The oxide semiconductor may be an oxide semiconductor containing indium (In). For example, the oxide semiconductor may be indium-tin oxide (ITO), indium-zinc oxide (IZO), indium-gallium oxide (IGO), indium-zinc-tin oxide (IZTO), indium-gallium-tin oxide (IGTO), indium-gallium-zinc-tin oxide (IGZTO), or the like, or a combination thereof.

In other embodiments, the semiconductor layer may include polycrystalline silicon. The polycrystalline silicon may be formed by crystallizing amorphous silicon, and the conductive regions of the active layer ACT1 may be doped regions doped with impurities.

A first gate insulating layer 13 may be disposed on the semiconductor layer and the buffer layer 12. The first gate insulating layer 13 may include a semiconductor layer, and may be disposed on the buffer layer 12. The first gate insulating layer 13 may work as a gate insulator of each of the thin-film transistors. The first gate insulating layer 13 may be formed of an inorganic layer including an inorganic material, such as at least one of silicon oxide (SiOx), silicon nitride (SiNx), silicon oxynitride (SiON), or may be formed of a stack of the materials on each other.

The first gate conductive layer may be disposed on the first gate insulating layer 13. The first gate conductive layer may include the gate electrode G1 of the first transistor T1 and a first capacitor electrode CSE1 of a storage capacitor. The gate electrode G1 may be disposed so that it overlaps the channel region ACT_c of the active layer ACT1 in the thickness direction. The first capacitor electrode CSE1 may be disposed so that it overlaps a second capacitor electrode CSE2 described later in the thickness direction. According to an embodiment of the disclosure, the first capacitor electrode CSE1 may be integrated with the gate electrode G1. The first capacitor electrode CSE1 may be disposed so that it overlaps the second capacitor electrode CSE2 in the thickness direction, and the storage capacitor may be formed between them.

The first gate conductive layer may be formed of a single layer or multiple layers of one of molybdenum (Mo), aluminum (Al), chromium (Cr), gold (Au), titanium (Ti), nickel (Ni), neodymium (Nd) and copper (Cu) or an alloy thereof. It is, however, to be understood that the disclosure is not limited thereto.

The first interlayer dielectric layer 15 may be disposed on the first gate conductive layer. The first interlayer dielectric layer 15 may serve as an insulating layer between the first gate conductive layer and other layers disposed thereon. The first interlayer dielectric layer 15 may be disposed so that it covers the first gate conductive layer to protect it. The first interlayer dielectric layer 15 may be formed of an inorganic layer including an inorganic material, such as at least one of silicon oxide (SiOx), silicon nitride (SiNx), silicon oxynitride (SiON), or may be formed of a stack of the materials on each other.

The first data conductive layer may be disposed on the first interlayer dielectric layer 15. The first data conductive layer may include a first source electrode Si and a first drain electrode Di of the first transistor T1, a data line DTL, and a second capacitor electrode CSE2.

The first source electrode Si and the first drain electrode Di of the first transistor T1 may be in contact with the conductive regions ACT_a and ACT_b of the active layer ACT1, respectively, through the contact holes penetrating through a second interlayer dielectric layer 17 and the first gate insulating layer 13. The first source electrode Si of the first transistor T1 may be electrically connected to the light-blocking layer BML through another contact hole.

The data line DTL may apply a data signal to another transistor (not shown) that may be included in the display device 10. Although not shown in the drawings, the data line DTL may be electrically connected to the source/drain electrodes of another transistor to transfer a signal applied from the data line DTL.

The second capacitor electrode CSE2 may be disposed to overlap the first capacitor electrode CSE1 in the thickness direction. According to an embodiment of the disclosure, the second capacitor electrode CSE2 may be integrally connected to the first source electrode Si.

The first data conductive layer may be formed of a single layer or multiple layers of one of molybdenum (Mo), aluminum (Al), chromium (Cr), gold (Au), titanium (Ti), nickel (Ni), neodymium (Nd) and copper (Cu) or an alloy thereof. It is, however, to be understood that the disclosure is not limited thereto.

The second interlayer dielectric layer 17 may be disposed on the first data conductive layer. The second interlayer dielectric layer 17 may serve as an insulating layer between the first data conductive layer and other layers disposed thereon. The second interlayer dielectric layer 17 may cover the first data conductive layer to protect it. The second interlayer dielectric layer 17 may be formed of an inorganic layer including an inorganic material, such as at least one of silicon oxide (SiOx), silicon nitride (SiNx) and silicon oxynitride (SiON), or may be formed of a stack of the materials on each other.

The second data conductive layer may be disposed on the second interlayer dielectric layer 17. The second data conductive layer may include a first voltage line VL1, a second voltage line VL2, and a first conductive pattern CDP. A high-level voltage (or a first supply voltage) may be applied to the first voltage line VL1 to be supplied to the first transistor T1, and a low-level voltage (or a second supply voltage) may be applied to the second voltage line VL2 to be supplied to the second electrode 22. An alignment signal necessary for aligning the light-emitting elements 30 during the process of fabricating the display device 10 may be applied to the second voltage line VL2.

The first conductive pattern CDP may be electrically connected to the second capacitor electrode CSE2 through a contact hole formed in the second interlayer dielectric layer 17. The second capacitor electrode CSE2 may be integrated with the first source electrode Si of the first transistor T1, and the first conductive pattern CDP may be electrically connected to the first source electrode Si. The first conductive pattern CDP may also come in contact with the first electrode 21 to be described later. The first transistor T1 may transfer the first supply voltage VDD applied from the first voltage line VL1 to the first electrode 21 through the first conductive pattern CDP. Although the second data conductive layer includes one second voltage line VL2 and one first voltage line VL1 in the example shown in the drawings, the disclosure is not limited thereto. The second data conductive layer may include more than one first voltage lines VL1 and second voltage lines VL2.

The second data conductive layer may be formed of a single layer or multiple layers of one of molybdenum (Mo), aluminum (Al), chromium (Cr), gold (Au), titanium (Ti), nickel (Ni), neodymium (Nd) and copper (Cu) or an alloy thereof. It is, however, to be understood that the disclosure is not limited thereto.

The first planarization layer 19 may be disposed on the second data conductive layer. The first planarization layer 19 may include an organic insulating material, e.g., an organic material such as polyimide (PI), to provide a flat surface.

On the first planarization layer 19, first banks BNL1, electrodes 21 and 22, light-emitting elements 30, contact electrodes CNE1 and CNE2, and a second bank BNL2 may be disposed. Insulating layers PAS1, PAS2, PAS3 and PAS4 may be disposed on the first planarization layer 19.

The first banks BNL1 may be disposed on (e.g., directly on) the first planarization layer 19. The first banks BNL1 may have a shape extended in the second direction DR2 within each of the sub-pixels PXn, and may not be extended to an adjacent sub-pixel PXn in the second direction DR2. They may be disposed in the emission area EMA. The first banks BNL1 may be spaced apart from each other in the first direction DR1, and the light-emitting elements 30 may be disposed therebetween. The first banks BNL1 may be disposed in each of the sub-pixels PXn to form a linear pattern in the display area DPA of the display device 10. Although two first banks BNL1 are shown in the drawings, the disclosure is not limited thereto. More than two first banks BNL1 may be disposed depending on the number of electrodes 21 and 22.

The first banks BNL1 may have a structure that at least partly protrudes from the upper surface of the first planarization layer 19. The protrusions of the first banks BNL1 may have inclined side surfaces. The light emitted from the light-emitting elements 30 may be reflected by the electrodes 21 and 22 disposed on the first banks BNL1 so that the light may exit toward the upper side of the first planarization layer 19. The first banks BNL1 may provide the area in which the light-emitting element 30 is disposed and may also serve as reflective partition walls that reflect light emitted from the light-emitting element 30 upward. The side surfaces of the first banks BNL1 may be inclined in a linear shape, but the disclosure is not limited thereto. The first banks BNL1 may have a semicircle or semi-ellipse shape with curved outer surface. The first banks BNL1 may include, but are not limited to, an organic insulating material such as polyimide (PI).

The electrodes 21 and 22 may be disposed on the first banks BNL1 and the first planarization layer 19. The electrodes 21 and 22 may include the first electrode 21 and the second electrode 22. The electrodes 21 and 22 may be extended in the second direction DR2 and may be spaced apart from each other in the first direction DR1.

The first electrode 21 and the second electrode 22 may be extended in the second direction DR2 in each of the sub-pixels PXn, and they may be spaced apart from other electrodes 21 and 22 in the cut area CBA. For example, the cut area CBA may be disposed between the emission areas EMA of the neighboring sub-pixels PXn in the second direction DR2, and the first electrode 21 and the second electrode 22 may be separated from another first electrode 21 and second electrode 22 disposed in an adjacent sub-pixel PXn in the second direction DR2 in the cut area CBA. It is, however, to be understood that the disclosure is not limited thereto. Some electrodes 21 and 22 may not be separated for each of the sub-pixels PXn but may be extended and disposed across adjacent sub-pixels PXn in the second direction DR2. In other embodiments, only one of the first electrode 21 and the second electrode 22 may be separated.

The first electrode 21 may be electrically connected to the first transistor T1 through a first contact hole CT1, and the second electrode 22 may be electrically connected to the second voltage line VL2 through a second contact hole CT2. For example, an extended portion of the first electrode 21 in the first direction DR1 of the second bank BNL2 may be in contact with the first conductive pattern CDP through the first contact hole CT1 penetrating through the first planarization layer 19. An extended portion of the second electrode 22 in the first direction DR1 of the second bank BNL2 may be in contact with the second voltage line VL2 through the second contact hole CT2 penetrating through the first planarization layer 19. It is, however, to be understood that the disclosure is not limited thereto. According to another embodiment, the first contact hole CT1 and the second contact hole CT2 may be formed in the emission area EMA surrounded by the second bank BNL2 so that they do not overlap the second bank BNL2.

Although one first electrode 21 and one second electrode 22 may be disposed for each of the sub-pixels PXn in the drawings, the disclosure is not limited thereto. More than one first electrode 21 and more than one second electrode 22 may be disposed in each of the sub-pixels PXn. The first electrode 21 and the second electrode 22 disposed in each of the sub-pixels PXn may not necessarily have a shape extended in one direction but may have a variety of structures. For example, the first electrode 21 and the second electrode 22 may have a partially curved or bent shape, and an electrode may be disposed to surround another electrode.

The first electrode 21 and the second electrode 22 may be disposed on (e.g., directly on) the first banks BNL1, respectively. The first electrode 21 and the second electrode 22 may have a larger width than the first banks BNL1. For example, the first electrode 21 and the second electrode 22 may be disposed to cover the outer surfaces of the first banks BNL1. The first electrode 21 and the second electrode 22 may be respectively disposed on the side surfaces of the first banks BNL1, and the distance between the first electrode 21 and the second electrode 22 may be smaller than the distance between the first banks BNL1. At least a portion of the first electrode 21 and the second electrode 22 may be disposed on (e.g., directly on) the first planarization layer 19 so that they may be located on the same plane. It is, however, to be understood that the disclosure is not limited thereto. In some implementations, the electrodes 21 and 22 may have a width smaller than that of the first banks BNL1. It is to be noted that the electrodes 21 and 22 may be disposed to cover at least one side surface of the first banks BNL1 to reflect light emitted from the light-emitting element 30.

Each of the electrodes 21 and 22 may include a conductive material having a high reflectance. For example, each of the electrodes 21 and 22 may include a metal such as silver (Ag), copper (Cu), aluminum (Al), or a combination thereof, as the material having a high reflectance, and may be an alloy including aluminum (Al), nickel (Ni), lanthanum (La), or the like. Each of the electrodes 21 and 22 may reflect light that may be emitted from the light-emitting element 30 and travel toward the side surfaces of the first banks BNL1 toward the upper side of each of the sub-pixels PXn.

It is, however, to be understood that the disclosure is not limited thereto. Each of the electrodes 21 and 22 may further include a transparent conductive material. For example, each of the electrodes 21 and 22 may include a material such as indium tin oxide (ITO), indium zinc oxide (IZO), indium tin zinc oxide (ITZO), or a combination thereof. In some embodiments, each of the electrodes 21 and 22 may have a structure in which one or more layers of a transparent conductive material and a metal layer having high reflectivity may be stacked on one another, or may be formed of a single layer including the materials. For example, each of the electrodes 21 and 22 may have a stack structure such as ITO/silver (Ag)/ITO/, ITO/Ag/IZO, or ITO/Ag/ITZO/IZO.

The electrodes 21 and 22 may be electrically connected to the light-emitting elements 30, and a voltage may be applied so that the light-emitting elements 30 can emit light. The electrodes 21 and 22 may be electrically connected to the light-emitting element 30 through the contact electrodes CNE1 and CNE2, and may transfer electrical signals applied thereto to the light-emitting element 30 through the contact electrodes CNE1 and CNE2.

One of the first electrode 21 and the second electrode 22 may be electrically connected to an anode electrode of the light-emitting element 30, while another may be electrically connected to a cathode electrode of the light-emitting element 30. It is, however, to be understood that the disclosure is not limited thereto. For example, the first electrode 21 may be electrically connected to the cathode electrode while the second electrode 22 may be electrically connected to the anode electrode.

The electrodes 21 and 22 may be utilized to form an electric field within the sub-pixels PXn to align the light-emitting elements 30. The light-emitting elements 30 may be disposed between the first electrode 21 and the second electrode 22 by an electric field formed on the first electrode 21 and the second electrode 22. The light-emitting elements 30 of the display device 10 may be sprayed on the electrodes 21 and 22 via an inkjet printing process. In case that the ink containing the light-emitting elements 30 may be sprayed onto the electrodes 21 and 22, an alignment signal may be applied to the electrodes 21 and 22 to generate an electric field. The light-emitting elements 30 dispersed in the ink may be aligned on the electrodes 21 and 22 by receiving the electrophoretic force by the electric field generated over the electrodes 21 and 22.

The first insulating layer PAS1 may be disposed on the first planarization layer 19. The first insulating layer PAS1 may be disposed to cover the first banks BNL1 and the first electrode 21 and the second electrode 22. The first insulating layer PAS1 can protect the first electrode 21 and the second electrode 22 and insulate them from each other. Contact between the light-emitting element 30 disposed on the first insulating layer PAS1 and other elements and resulting damage may be prevented.

According to an embodiment of the disclosure, the first insulating layer PAS1 may include openings OP partially exposing the first electrode 21 and the second electrode 22. The openings OP may partially expose portions of the electrodes 21 and 22 disposed on the upper surface of the first banks BNL1. Portions of the contact electrodes CNE1 and CNE2 may be in contact with the electrodes 21 and 22 exposed through the openings OP, respectively.

The first insulating layer PAS1 may have a level difference so that a portion of the upper surface is recessed between the first electrode 21 and the second electrode 22. For example, as the first insulating layer PAS1 is disposed to cover the first electrode 21 and the second electrode 22, the upper surface thereof may have level differences along the shape of the electrodes 21 and 22 disposed thereunder. It is, however, to be understood that the disclosure is not limited thereto.

The second bank BNL2 may be disposed on the first insulating layer PAS1. The second bank BNL2 may be disposed in a lattice pattern on the entire surface of the display area DPA including portions extended in the first direction DR1 and the second direction DR2 when viewed from the top. The second bank BNL2 may be disposed along the border of each of the sub-pixels PXn to distinguish adjacent sub-pixels PXn from one another.

The second bank BNL2 may be disposed to surround the emission area EMA and the cut area CBA disposed in each of the sub-pixels PXn to distinguish the emission area EMA and the cut area CBA. The first electrode 21 and the second electrode 22 may be extended in the second direction DR2 and may be disposed across a portion of the second bank BNL2 that may be extended in the first direction DR1. The portion of the second bank BNL2 extended in the second direction DR2 may have a larger width between the emission areas EMA than between the cut areas CBA. Accordingly, the distance between the cut areas CBA may be smaller than the distance between the emission areas EMA.

The second bank BNL2 may have a height greater than a height of the first banks BNL1. The second bank BNL2 can prevent the ink in which different light-emitting elements 30 may be dispersed from overflowing to adjacent sub-pixels PXn during the inkjet printing process of the processes of fabricating the display device 10, so that different sub-pixels PXn can be separated from one another and the ink may not be mixed. The second bank BNL2 may include, but is not limited to, polyimide (PI), like the first banks BNL1.

The light-emitting elements 30 may be disposed on the first insulating layer PAS1. The light-emitting elements 30 may be spaced apart from one another in the second direction DR2 in which the electrodes 21 and 22 may be extended, and may be aligned substantially parallel to one another. The light-emitting elements 30 may have a shape extended in one direction. The direction in which the electrodes 21 and 22 may be extended may be substantially perpendicular to the direction in which the light-emitting elements 30 may be extended. It is, however, to be understood that the disclosure is not limited thereto. The light-emitting elements 30 may be oriented obliquely to the direction in which the electrodes 21 and 22 may be extended, rather than being perpendicular to it.

The light-emitting elements 30 disposed in each of the sub-pixels PXn may include the emissive layer 36 (see FIG. 4) including different materials and may emit lights with different wavelength ranges to the outside. Accordingly, lights of the first color, the second color and the third color may be emitted from the first sub-pixel PX1, the second sub-pixel PX2 and the third sub-pixel PX3, respectively. It is, however, to be understood that the disclosure is not limited thereto. The sub-pixels PXn may include the same kind of light-emitting elements 30 and may emit light of substantially the same color.

Ends of the elements 30 may be disposed on the electrodes 21 and 22 between the first banks BNL1. The length of the light-emitting elements 30 may be larger than the distance between the first electrode 21 and the second electrode 22, and the ends of the light-emitting elements 30 may be disposed on the first electrode 21 and the second electrode 22, respectively. For example, an end of each of the light-emitting elements 30 may be located on the first electrode 21, while another end thereof may be located on the second electrode 22.

Multiple layers of the light-emitting elements 30 may be disposed in the direction parallel to the upper surface of the substrate 11 or the first planarization layer 19. The light-emitting elements 30 may be arranged such that one extending direction may be parallel to the upper surface of the first planarization layer 19, and semiconductor layers included in the light-emitting elements 30 may be disposed sequentially in the direction parallel to the upper surface of the first planarization layer 19. It is, however, to be understood that the disclosure is not limited thereto. In case that the light-emitting elements 30 have a different structure, semiconductor layers may be arranged in the direction perpendicular to the upper surface of the first planarization layer 19.

The ends of each of the light-emitting elements 30 may be in contact with the contact electrodes CNE1 and CNE2, respectively. For example, a portion of the semiconductor layer of the light-emitting element 30 may be exposed because the insulating layer 38 (see FIG. 4) may not be formed at the end surface on the side of the extending direction, and the exposed portion of the semiconductor layer may be in contact with the contact electrode CNE1 and CNE2. It is, however, to be understood that the disclosure is not limited thereto. At least a portion of the insulating layer 38 may be removed so that both end surfaces of the semiconductor layers of the light-emitting element 30 may be partially exposed. The exposed surfaces of the semiconductor layer may be in contact with the contact electrodes CNE1 and CNE2.

The second insulating layer PAS2 may be partially disposed on the light-emitting elements 30. For example, the second insulating layer PAS2 may have a width smaller than the length of the light-emitting elements 30 and may be disposed on the light-emitting elements 30 so that both ends of the light-emitting elements 30 may be exposed while being surrounded by the second insulating layer PAS2. The second insulating layer PAS2 may be disposed to cover the light-emitting elements 30, the electrodes 21 and 22 and the first insulating layer PAS1 and may be removed so that both ends of the light-emitting elements 30 may be exposed during the process of fabricating the display device 10. The second insulating layer PAS2 may be extended in the second direction DR2 on the first insulating layer PAS1 when viewed from the top, thereby forming a linear or island-like pattern in each of the sub-pixels PXn. The second insulating layer PAS2 can protect the light-emitting elements 30 and fix the light-emitting elements 30 during the process of fabricating the display device 10.

Contact electrodes CNE1 and CNE2 and a third insulating layer PAS3 may be disposed on the second insulating layer PAS2.

The contact electrodes CNE1 and CNE2 may have a shape extended in one direction and may be disposed on the electrodes 21 and 22. The contact electrodes CNE1 and CNE2 may include a first contact electrode CNE1 disposed on the first electrode 21 and a second contact electrode CNE2 disposed on the second electrode 22. The contact electrodes CNE1 and CNE2 may be disposed spaced apart from each other and face each other. For example, the first contact electrode CNE1 and the second contact electrode CNE2 may be disposed on the first electrode 21 and the second electrode 22, respectively, and may be spaced apart from each other in the first direction DR1. The contact electrodes CNE1 and CNE2 may form a stripe pattern in the emission area EMA of each of the sub-pixels PXn.

Each of the contact electrodes CNE1 and CNE2 may be in contact with the light-emitting elements 30. The first contact electrode CNE1 may be in contact with an end of each of the light-emitting elements 30, and the second contact electrode CNE2 may be in contact with another end of each of the light-emitting elements 30. The semiconductor layers may be exposed at both end surfaces of the light-emitting elements 30 in the extended direction, and the contact electrodes CNE1 and CNE2 may be in electrical contact with the semiconductor layers and may be electrically connected to them. The sides of the contact electrodes CNE1 and CNE2 in contact with both ends of the light-emitting elements 30 may be disposed on the second insulating layer PAS2. The first contact electrode CNE1 may be in contact with the first electrode 21 through an opening OP exposing a portion of the upper surface of the first electrode 21, and the second contact electrode CNE2 may be in contact with the second electrode through an opening OP exposing a portion of the upper surface of the second electrode 22.

The width of the contact electrodes CNE1 and CNE2 that may be measured in one direction may be smaller than the width of the electrodes 21 and 22 that may be measured in the direction. The contact electrodes CNE1 and CNE2 may be in contact with the ends and the other ends of the light-emitting elements 30 and may cover a portion of the upper surface of each of the first electrode 21 and the second electrode 22. It is, however, to be understood that the disclosure is not limited thereto. The width of the contact electrodes CNE1 and CNE2 may be larger than that of the electrodes 21 and 22 to cover both sides of the electrodes 21 and 22.

The contact electrodes CNE1 and CNE2 may include a transparent, conductive material. For example, the contact electrodes may include ITO, IZO, ITZO, aluminum (Al), or the like, or a combination thereof. Light emitted from the light-emitting elements 30 may pass through the contact electrodes CNE1 and CNE2 and travel toward the electrodes 21 and 22. It is, however, to be understood that the disclosure is not limited thereto.

Although the two contact electrodes CNE1 and CNE2 may be disposed in one sub-pixel PXn in the drawings, the disclosure is not limited thereto. The number of the contact electrodes CNE1 and CNE2 may vary depending on the number of electrodes 21 and 22 disposed for each of the sub-pixels PXn.

The third insulating layer PAS3 may be disposed to cover the first contact electrode CNE1. The third insulating layer PAS3 may be disposed to cover one side of the second insulating layer PAS2 on which the first contact electrode CNE1 may be disposed. For example, the third insulating layer PAS3 may be disposed to cover the first contact electrode CNE1 and the first insulating layers PAS1 disposed on the first electrode 21. Such arrangement may be formed by disposing an insulating material layer for forming the third insulating layer PAS3 entirely on the emission area EMA, and removing a portion of the insulating material layer in order to form the second contact electrode CNE2. During the above process, the insulating material layer forming the third insulating layer PAS3 may be removed together with the insulating material layer forming the second insulating layer PAS2. One side of the third insulating layer PAS3 may be aligned with one side of the second insulating layer PAS2. One side of the second contact electrode CNE2 may be disposed on the third insulating layer PAS3 and may be insulated from the first contact electrode CNE1 with the third insulating layer PAS3 therebetween.

The fourth insulating layer PAS4 may be disposed entirely on the display area DPA of the substrate 11. The fourth insulating layer PAS4 may protect elements disposed on the substrate 11 against the external environment. It is to be noted that the fourth insulating layer PAS4 may be eliminated.

Each of the above-described first insulating layer PAS1, second insulating layer PAS2, third insulating layer PAS3 and fourth insulating layer PAS4 may include an inorganic insulating material, an organic insulating material, or a combination thereof. For example, the first insulating layer PAS1, the second insulating layer PAS2, the third insulating layer PAS3 and the fourth insulating layer PAS4 may include an inorganic insulating material such as silicon oxide (SiOx), silicon nitride (SiNx), silicon oxynitride (SiOxNy), aluminum oxide ($Al_2O_3$) or aluminum nitride (AlN), or a combination thereof. In other embodiments, they may include, as an organic insulating material, an acrylic resin, an epoxy resin, a phenol resin, a polyamide resin, a polyimide resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, a polymethyl methacrylate-polycarbonate synthetic resin, etc., or a combination thereof. It is, however, to be understood that the disclosure is not limited thereto.

Figure 4:
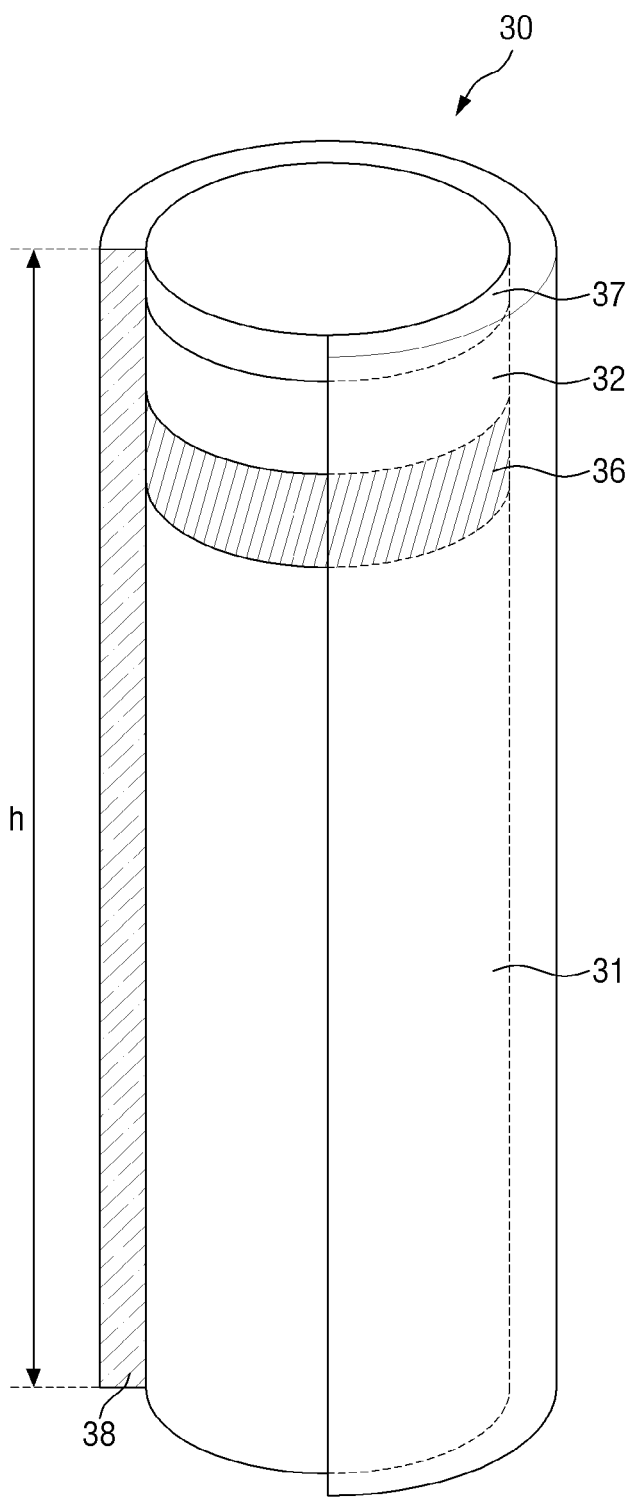
FIG. 4 is a schematic perspective view showing a light-emitting element according to an embodiment of the disclosure.

FIG. 4 is a schematic perspective view schematically showing a light-emitting element according to an embodiment of the disclosure.

Referring to FIG. 4, the light-emitting element 30 may be a light-emitting diode. Specifically, the light-emitting element 30 may have a size in micrometers or nanometers and may be an inorganic light-emitting diode formed of an inorganic material. By forming an electric field in a direction between the two electrodes 21 and 22 facing each other (see FIG. 3), an inorganic light-emitting diode may be aligned between the two electrodes 21 and 22 (see FIG. 3) where polarities may be formed. The light-emitting element 30 may be aligned between the electrodes by the electric field formed over the two electrodes 21 and 22 (see FIG. 3).

The light-emitting element 30 according to an embodiment may have a shape extended in one direction. The light-emitting element 30 may have a shape of a cylinder, a rod, a wire, a tube, or the like. It is to be understood that the shape of the light-emitting element 30 is not limited thereto. The light-emitting element 30 may have a variety of shapes including a polygonal column shape such as a cube, a cuboid and a hexagonal column, or a shape that may be extended in a direction with partially inclined outer surfaces. The semiconductors included in the light-emitting element 30 to be described later may have a structure sequentially arranged or stacked on one another along the one direction.

The light-emitting element 30 may include a semiconductor layer doped with impurities of a conductive type (e.g., p-type or n-type). The semiconductor layer may emit light of a certain wavelength band by transmitting an electric signal applied from an external power source.

As shown in FIG. 4, the light-emitting element 30 may include a first semiconductor layer 31, a second semiconductor layer 32, an emissive layer 36, an electrode layer 37 and an insulating layer 38.

The first semiconductor layer 31 may be an n-type semiconductor. In case that the light-emitting element 30 emits light of a blue wavelength band, the first semiconductor layer 31 may include a semiconductor material having a composition ratio: $Al_xGa_yIn_{1-x-y}N$ ($0 \le x \le 1$, $0 \le y \le 1$, $0 \le x+y \le 1$). For example, it may be at least one of n-type doped AlGaInN, GaN, AlGaN, InGaN, AlN and InN. The first semiconductor layer 31 may be doped with an n-type dopant, and the n-type dopant may be Si, Ge, Sn, or the like. For example, the first semiconductor layer 31 may be n-GaN doped with n-type Si. The length of the first semiconductor layer 31 may range, but is not limited to, from about 1.5 µm to about 5 µm.

The second semiconductor layer 32 may be disposed on the emissive layer 36 to be described later. The second semiconductor layer 32 may be a p-type semiconductor. In case that the light-emitting element 30 emits light of a blue or green wavelength band, the second semiconductor layer 32 may include a semiconductor material having a composition ratio: $Al_xGa_yIn_{1-x-y}N$ ($0 \le x \le 2$, $0 \le y \le 1$, $0 \le x+y \le 1$). For example, it may be at least one of p-type doped AlGaInN, GaN, AlGaN, InGaN, AlN and InN. The second semiconductor layer 32 may be doped with a p-type dopant, and the p-type dopant may be Mg, Zn, Ca, Se, Ba, or the like. For example, the second semiconductor layer 32 may be p-GaN doped with p-type Mg. The length of the second semiconductor layer 32 may range, but is not limited to, from about 0.05 µm to about 0.10 µm.

Although each of the first semiconductor layer 31 and the second semiconductor layer 32 may be implemented as a signal layer in the drawings, the disclosure is not limited thereto. Depending on the material of the emissive layer 36, the first semiconductor layer 31 and the second semiconductor layer 32 may further include a larger number of layers, e.g., a clad layer or a tensile strain barrier reducing (TSBR) layer.

The emissive layer 36 may be disposed between the first semiconductor layer 31 and the second semiconductor layer 32. The emissive layer 36 may include a material having a single or multiple quantum well structure. In case that the emissive layer 36 includes a material having the multiple quantum well structure, the structure may include quantum layers and well layers alternately stacked on one another. The emissive layer 36 may emit light as electron-hole pairs may be combined therein in response to an electrical signal applied through the first semiconductor layer 31 and the second semiconductor layer 32. In case that the emissive layer 36 emits light of the blue wavelength band, it may include a material such as AlGaN and AlGaInN. In particular, in case that the emissive layer 36 has a multi-quantum well structure in which quantum layers and well layers may be alternately stacked on one another, the quantum layers may include AlGaN or AlGaInN, and the well layers may include a material such as GaN and AlGaN. For example, the emissive layer 36 may include AlGaInN as the quantum layer and AlInN as the well layer, and, as described above, the emissive layer 36 may emit blue light having a center wavelength band of about 450 nm to about 495 nm.

It is, however, to be understood that the disclosure is not limited thereto. The emissive layer 36 may have a structure in which a semiconductor material having a large band gap energy and a semiconductor material having a small band gap energy may be alternately stacked on one another, and may include other Group III to Group V semiconductor materials depending on the wavelength range of the emitted light. Accordingly, the light emitted from the emissive layer 36 is not limited to the light of the blue wavelength band. The emissive layer 36 may emit light of red or green wavelength band in some implementations. The length of the emissive layer 36 may be, but is not limited to, in the range of about 0.05 µm to about 0.10 µm.

The light emitted from the emissive layer 36 may exit not only through the outer surfaces of the light-emitting element 30 in the longitudinal direction but also through both side surfaces. The direction in which the light emitted from the emissive layer 36 propagates may not be limited to one direction.

Figure 5:
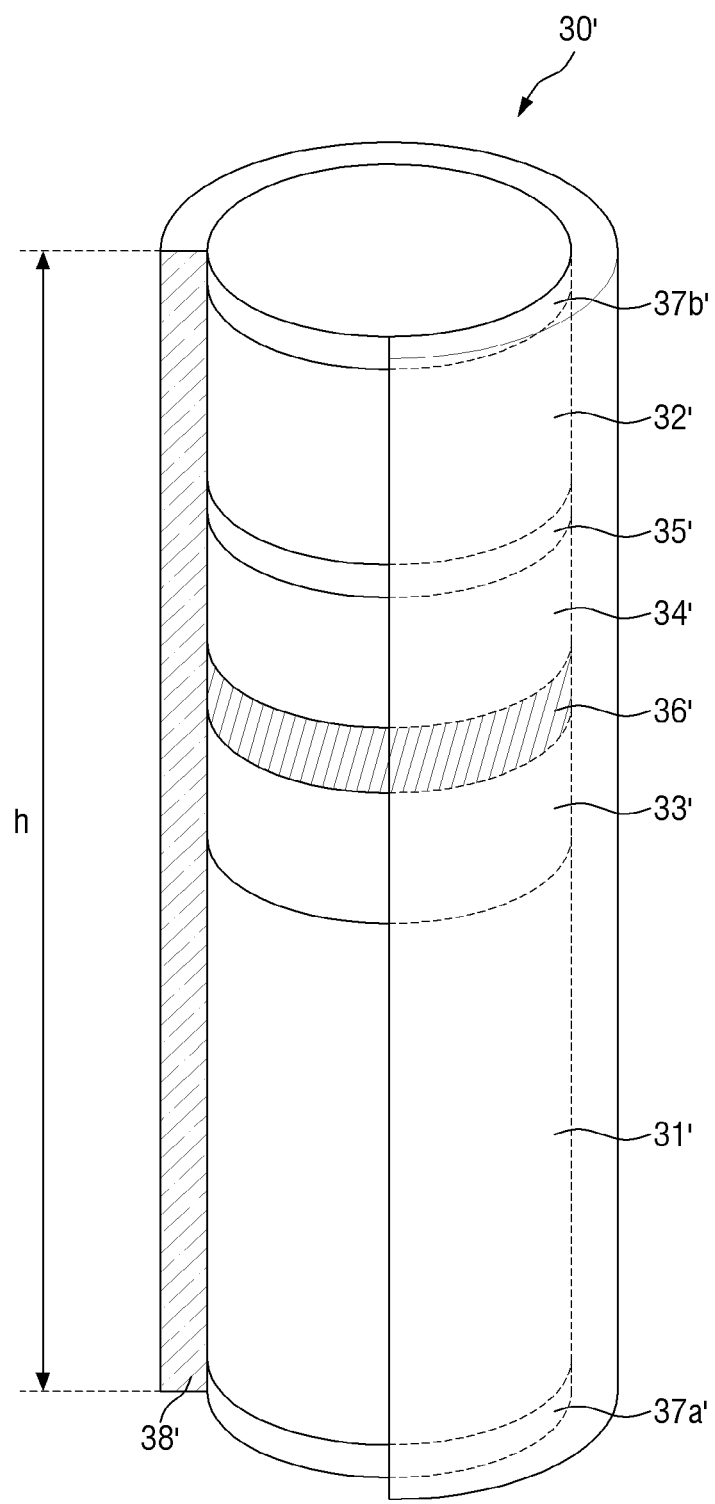
FIG. 5 is a schematic perspective view showing a light-emitting element according to another embodiment of the disclosure.

FIG. 5 is a schematic perspective view showing a light-emitting element according to another embodiment of the disclosure.

Referring to FIG. 5, a light-emitting element 30' according to another embodiment may further include a third semiconductor layer 33' disposed between a first semiconductor layer 31' and an emissive layer 36', and a fourth semiconductor layer 34' and a fifth semiconductor layer 35' disposed between the emissive layer 36' and the second semiconductor layer 32'. The light-emitting element 30' of FIG. 5 may be different from the light-emitting element of FIG. 4 in that semiconductor layers 33', 34' and 35' and electrode layers 37a' and 37b' may be further disposed, and that an emissive layer 36' may contain different elements. In the following description, descriptions will focus on the differences, and redundant description will be omitted.

The emissive layer 36 of the light-emitting element 30 of FIG. 4 may include nitrogen (N) and thus may emit blue or green light. On the other hand, in the light-emitting element 30' of FIG. 5, the emissive layer 36' and other semiconductor layers each may be a semiconductor including at least phosphorus (P). The light-emitting element 30' according to an embodiment of the disclosure may emit red light having a center wavelength band of about 620 nm to about 750 nm. It is, however, to be understood that the center wavelength band of red light may not be limited to the above numerical values and may encompass all wavelength ranges that can be recognized as red in the art.

Specifically, the first semiconductor layer 31' may include, as an n-type semiconductor layer, a semiconductor material having a composition ratio: $In_xAl_yGa_{1-x-y}P$ ($0 \le x \le 1$, $0 \le y \le 1$, $0 \le x+y \le 1$). The first semiconductor layer 31' may be one or more of n-type InAlGaP, GaP, AlGaP, InGaP, AlP and InP. For example, the first semiconductor layer 31' may be n-AlGaInP doped with n-type Si.

The second semiconductor layer 32' may include, as a p-type semiconductor layer, a semiconductor material having a composition ratio: $In_xAl_yGa_{1-x-y}P$ ($0 \le x \le 1$, $0 \le y \le 1$, $0 \le x+y \le 1$). The second semiconductor layer 32' may be one or more of p-type InAlGaP, GaP, AlGaNP, InGaP, AlP and InP. For example, the second semiconductor layer 32' may be p-GaP doped with p-type Mg.

The emissive layer 36' may be disposed between the first semiconductor layer 31' and the second semiconductor layer 32'. The emissive layer 36' may include a material having a single or multiple quantum well structure and may emit light of a certain wavelength band. In case that the emissive layer 36' has a multi-quantum well structure in which quantum layers and well layers may be alternately stacked on one another, the quantum layers may include AlGaP or AlInGaP, and the well layers may include GaP or AlInP. For example, the emissive layer 36' may include AlGaInP as the quantum layers and AlInP as the well layers and may emit red light having a central wavelength band of about 620 nm to about 750 nm.

The light-emitting element 30' of FIG. 5 may include a clad layer disposed adjacent to the emissive layer 36'. As shown in FIG. 5, the third semiconductor layer 33' and the fourth semiconductor layer 34' disposed under and on the emissive layer 36' between the first semiconductor layer 31' and the second semiconductor layer 32' may be clad layers.

The third semiconductor layer 33' may be disposed between the first semiconductor layer 31' and the emissive layer 36'. The third semiconductor layer 33' may be a n-type semiconductor like the first semiconductor layer 31', and may include a semiconductor material having a composition ratio: $In_xAl_yGa_{1-x-y}P$ ($0 \le x \le 1$, $0 \le y \le 1$, $0 \le x+y \le 1$). For example, the first semiconductor layer 31' may be n-AlGaInP, and the third semiconductor layer 33' may be n-AlInP. It is, however, to be understood that the disclosure is not limited thereto.

The fourth semiconductor layer 34' may be disposed between the emissive layer 36' and the second semiconductor layer 32'. The fourth semiconductor layer 34' may be a n-type semiconductor like the second semiconductor layer 32', and may include a semiconductor material having a composition ratio: $In_xAl_yGa_{1-x-y}P$ ($0 \le x \le 1$, $0 \le y \le 1$, $0 \le x+y \le 1$). For example, the second semiconductor layer 32' may be p-GaP, and the fourth semiconductor layer 34' may be p-AlInP.

The fifth semiconductor layer 35' may be disposed between the fourth semiconductor layer 34' and the second semiconductor layer 32'. The fifth semiconductor layer 35' may be a p-type doped semiconductor, like the second semiconductor layer 32' and the fourth semiconductor layer 34'. In some embodiments, the fifth semiconductor layer 35' may reduce a difference in lattice constant between the fourth semiconductor layer 34' and the second semiconductor layer 32'. The fifth semiconductor layer 35' may be a tensile strain barrier reducing (TSBR) layer. For example, the fifth semiconductor layer 35' may include, but is not limited to, p-GaInP, p-AlInP, p-AlGaInP, etc. The length of the third semiconductor layer 33', the fourth semiconductor layer 34' and the fifth semiconductor layer 35' may be, but is not limited to, a range of about 0.08 μmm to about 0.25 μm.

The first electrode layer 37a' and the second electrode layer 37b' may be disposed on the first semiconductor layer 31' and the second semiconductor layer 32', respectively. The first electrode layer 37a' may be disposed on the lower surface of the first semiconductor layer 31', and the second electrode layer 37b' may be disposed on the upper surface of the second semiconductor layer 32'. It is, however, to be understood that the disclosure is not limited thereto. At least one of the first electrode layer 37a' and the second electrode layer 37b' may be eliminated. For example, in the light-emitting element 30', the first electrode layer 37a' may not be disposed on the lower surface of the first semiconductor layer 31', and only one second electrode layer 37b' may be disposed on the upper surface of the second semiconductor layer 32'.

Referring back to FIG. 4, the electrode layer 37 may be an ohmic contact electrode. It is, however, to be understood that the disclosure is not limited thereto. The electrode layer may be Schottky contact electrodes. The light-emitting element 30 may include at least one electrode layer 37. Although the light-emitting element 30 may include one electrode layer 37 in the example shown in FIG. 4, the disclosure is not limited thereto. In some implementations, the light-emitting element 30 may include a larger number of electrode layers 37 or the electrode layer may be omitted. The following description on the light-emitting element 30 may be equally applied even if the number of electrode layers 37 may be different or it further includes other structures.

The electrode layer 37 can reduce the resistance between the light-emitting element 30 and the electrodes or the contact electrodes in case that the light-emitting element 30 may be electrically connected to the electrodes or the contact electrodes in the display device 10 according to an embodiment of the disclosure. The electrode layer 37 may include a metal having conductivity. For example, the electrode layer 37 may include at least one of aluminum (Al), titanium (Ti), indium (In), gold (Au), silver (Ag), indium tin oxide (ITO), indium zinc oxide (IZO) and indium tin-zinc oxide (ITZO). The electrode layer 37 may include a semiconductor material doped with n-type or p-type impurities. The electrode layer 37 may include the same material or may include different materials. It is, however, to be understood that the disclosure is not limited thereto.

The insulating layer 38 may be disposed to surround the outer surfaces of the semiconductor layers and electrode layers described above. For example, the insulating layer 38 may be disposed to surround at least the outer surface of the emissive layer 36, and may be extended in a direction in which the light-emitting element 30 may be extended. The insulating layer 38 may serve to protect the above-described elements. The insulating layer 38 may be formed to surround the side surfaces of the elements, and both ends of the light-emitting element 30 in the longitudinal direction may be exposed.

Although the insulating layer 38 may be extended in the longitudinal direction of the light-emitting element 30 to cover from the first semiconductor layer 31 to the side surface of the electrode layer 37 in the example shown in the drawing, the disclosure is not limited thereto. The insulating layer 38 may cover only the outer surface of a portion of the semiconductor layer, including the light-emitting layer 36, or may cover only a portion of the outer surface of the electrode layer 37 to partially expose the outer surface of the electrode layer 37. A portion of the upper surface of the insulating layer 38 may be rounded which may be adjacent to at least one end of the light-emitting element 30 in cross section.

The thickness of the insulating layer 38 may be, but is not limited to, in the range of about 10 nm to about 1.0 μm. The thickness of the insulating layer 38 may be approximately 40 nm.

The insulating layer 38 may include materials having an insulating property such as silicon oxide (SiOx), silicon nitride (SiNx), silicon oxynitride (SiOxNy), aluminum nitride (AlN), aluminum oxide ($Al_2O_3$), or a combination thereof. Accordingly, it may be possible to prevent an electrical short-circuit that may occur in case that the emissive layer 36 comes in contact with an electrode through which an electric signal may be transmitted to the light-emitting element 30. Since the insulating layer 38 may include the emissive layer 36 to protect the outer surface of the light-emitting element 30, it may be possible to prevent a decrease in luminous efficiency.

The outer surface of the insulating layer 38 may be subjected to surface treatment. The light-emitting elements 30 may be dispersed in an ink, and the ink may be sprayed onto the electrode. In doing so, a surface treatment may be applied to the insulating layer 38 so that it becomes hydrophobic or hydrophilic in order to keep the light-emitting elements 30 dispersed in the ink from being aggregated with one another. For example, the outer surface of the insulating layer 38 may be subjected to surface treatment with a material such as stearic acid and 2,3-naphthalene dicarboxylic acid.

The length h of the light-emitting elements 30 may range from about 1 μm to about 10 μm or from about 2 μm to about 6 μm, and about 3 μm to about 5 μm. The diameter of the light-emitting elements 30 may range from about 30 nm to about 700 nm, and the aspect ratio of the light-emitting elements 30 may range from about 1.2 to about 100. It is, however, to be understood that the disclosure is not limited thereto. The light-emitting elements 30 included in the display device 10 may have different diameters depending on compositional difference of the emissive layer 36. The diameter of the light-emitting elements 30 may be approximately 500 nm.

The shape and material of the light-emitting elements 30 are not limited to those shown in FIGS. 4 and 5. For example, in some embodiments, the light-emitting elements 30 may include a greater number of layers or may have different shapes.

Hereinafter, an inkjet printing apparatus for fabricating the display device according to an embodiment described above and an inspection apparatus for inspecting the display device will be described.

An inkjet printing apparatus 1000 according to an embodiment of the disclosure may spray an ink onto a target substrate and may align particles dispersed in the ink IN, such as light-emitting elements on the target substrate. An inspection apparatus 700 may measure the gray value of an area of the target substrate where the light-emitting elements may be aligned.

Initially, the inkjet printing apparatus 1000 according to an embodiment of the disclosure may include an inkjet head apparatus 300 and a stage part 500.

Figure 6:
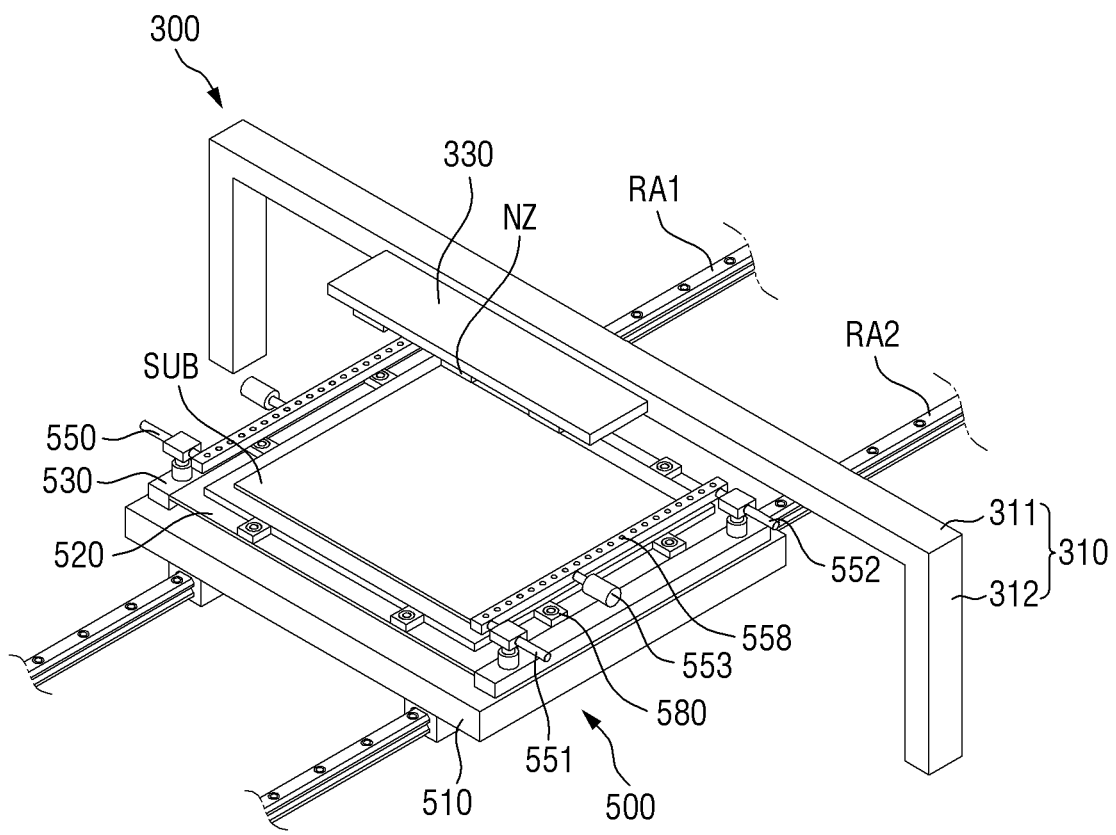
FIG. 6 is a schematic perspective view of an inkjet printing apparatus according to an embodiment of the disclosure.

FIG. 6 is a schematic perspective view of an inkjet printing apparatus according to an embodiment of the disclosure.

In the drawings, a first direction DR1, a second direction DR2 and a third direction DR3 may be defined. The first direction DR1 and the second direction DR2 may be located on a plane and may be orthogonal to each other, and the third direction DR3 may be perpendicular to the first direction DR1 and the second direction DR2.

FIG. 6 is a view for illustrating the configuration of the inkjet printing apparatus 1000 according to an embodiment of the disclosure. It is to be noted that the structure and arrangement of the inkjet printing apparatus 1000 is not limited to those shown in FIG. 6. The inkjet printing apparatus 1000 may include more elements and may have a different structure from that of FIG. 6.

Referring to FIG. 6, the inkjet printing apparatus 1000 may include the inkjet head apparatus 300 and the stage part 500. FIG. 6 shows the inkjet head apparatus 300 and the stage part 500 of the inkjet printing apparatus 1000. More than one stage part 500 may be disposed in the inkjet printing apparatus 1000.

The inkjet printing apparatus 1000 may include a first rail RA1 and a second rail RA2 extended in one direction, e.g., the second direction DR2, and the devices may be arranged in the second direction DR2 along the first and second rails RA1 and RA2. The first rail RA1 and the second rail RA2 of FIG. 6 may be extended in the second direction DR2 and may be respectively extended to the first rail RA1 and the second rail RA2 of FIG. 7 to be described later. The devices shown in FIGS. 6 and 7 may form the single inkjet printing apparatus 1000. Hereinafter, the devices or elements will be described in detail.

Referring to FIG. 6, the inkjet head apparatus 300 according to an embodiment of the disclosure may include a first base frame 310 and an inkjet head part 330 coupled to the frame 310. The inkjet head apparatus 300 may spray an ink IN onto a target substrate SUB through an ink ejecting member.

The first base frame 310 may include a first base 311 extended in the first direction DR1, and first supports 312 extended to the ends of the first base 311, extended in the third direction DR3 and supporting the first base 311. The shape of the first base frame 310 is not particularly limited herein. The first base frame 310 may include the first base 311 extended in the first direction DR1, and the inkjet head part 330 may move in the first direction DR1 on the first base 311.

The inkjet head part 330 may be disposed on the first base 311 of the first base frame 310. Although not shown in the drawings, the inkjet head part 330 may be connected to a separate ink reservoir to receive the ink IN, and may spray the ink IN onto the target substrate SUB through the inkjet head. It is, however, to be understood that the disclosure is not limited thereto.

The inkjet head part 330 may be mounted on the first base 311 of the first base frame 310 and may have, for example, a shape extended in the first direction DR1. The inkjet head part 330 may be spaced apart from the stage part 500 by a spacing. In an embodiment, the inkjet head part 330 may further include a moving member so that it can move in the direction in which the first base 311 of the first base frame 310 may be extended, i.e., the first direction DR1. The inkjet head part 330 may include nozzles NZ to spray the ink IN onto the target substrate SUB. The nozzles NZ may be located on the bottom of the inkjet head part 330.

The stage part 500 may move in the second direction DR2 inside the inkjet printing apparatus 1000. Once the target substrate SUB is prepared on the stage part 500 and the ink IN may be sprayed onto the target substrate SUB, an electric field may be formed in the ink IN. The light-emitting elements DP in the ink IN may be aligned in one direction by the electric field formed on the target substrate SUB.

The stage part 500 may include a stage 510, a sub-stage 520, a probe support 530, a probe part 550 and an aligner 580.

The stage 510 may support the elements disposed on the stage part 500. The stage 510 may be disposed on the first rail RA1 and the second rail RA2 and may move in the second direction DR2 in the inkjet printing apparatus 1000 to reciprocate. Although not shown in the drawings, a moving member may be disposed on the lower surface of the stage 510, and the moving member may be engaged with the first and second rails RA1 and RA2 to move the stage 510 in a direction. During the process of the inkjet printing apparatus 1000, each device may be driven with the movement of the stage 510, and the stage 510 may be moved according to the process sequence of the inkjet printing apparatus 1000. The shape of the stage 510 is not particularly limited herein. For example, the stage 510 may have a rectangular shape with the sides extended in the first direction DR1 and the second direction DR2, as shown in the drawings.

The sub-stage 520 may be disposed on the stage 510. The sub-stage 520 may provide a space in which the target substrate SUB may be placed. The probe support 530, the probe part 550 and the aligner 580 may be disposed on the sub-stage 520. The shape of the sub-stage 520 may be substantially identical to that of the stage 510 but may have a smaller area. It is to be noted that the general shape of the sub-stage 520 may vary depending on the shape of the target substrate SUB when viewed from the top. For example, when the target substrate SUB has a rectangular shape when viewed from the top, the shape of the sub-stage 520 may be rectangular as shown in the drawing. When the target substrate SUB has a circular shape when viewed from the top, the sub-stage 520 may also be circular when viewed from the top.

At least one aligner 580 may be disposed on the sub-stage 520. The aligner 580 may be disposed on each of the sides of the sub-stage 520, and the target substrate SUB may be placed in the area defined by aligners 580. In FIG. 6, two aligners 580 spaced apart from each other may be disposed on each of the sides of the sub-stage 520, and thus the total of eight aligners 580 may be disposed on the sub-stage 520. It is, however, to be understood that the disclosure is not limited thereto. The number and arrangement of the aligners 580 may vary depending on the shape or type of the target substrate SUB.

The probe support 530 and the probe part 550 may be disposed on the sub-stage 520. The probe support 530 may provide a space in which the probe part 550 may be disposed on the sub-stage 520. Specifically, the probe support 530 may be disposed on at least one side on the sub-stage 520, and may be extended in the extending direction of the side. For example, as shown in the drawing, the probe support 530 may be extended in the second direction DR2 on the left and right sides on the sub-stage 520. It is, however, to be understood that the disclosure is not limited thereto. More probe supports 530 may be included. In some implementations, they may be disposed on the upper and lower sides of the sub-stage 520. For example, the structure of the probe supports 530 may vary depending on the number or the arrangement or structure of the probe part 550 included in the stage part 500.

The probe part 550 may be disposed on the probe support 530 to form an electric field on the target substrate SUB prepared on the sub-stage 520. The probe part 550 may be extended in one direction, for example, the second direction DR2, like the probe supports 530, and the length may cover the entire target substrate SUB. For example, the sizes and shapes of the probe supports 530 and the probe part 550 may vary depending on the target substrate SUB.

According to an embodiment of the disclosure, the probe part 550 may include a probe driver 553 disposed on the probe supports 530, a probe pad 558 connected to the probe driver 553 and capable of being in contact with the target substrate SUB, and probe jigs 551 and 552 connected to the probe pad 558 to transmit electrical signals.

The probe driver 553 may be disposed on the probe supports 530 to move the probe pad 558. In an embodiment, the probe driver 553 may move the probe pad 558 in a horizontal direction and a vertical direction, for example, a first direction DR1 that may be the horizontal direction and a third direction DR3 that may be the vertical direction. The probe pad 558 may be extended to or separated from the target substrate SUB by the driving of the probe driver 553. During the process of the inkjet printing apparatus 1000, the probe driver 553 may be driven to connect the probe pad 558 with the target substrate SUB in the step of forming an electric field on the target substrate SUB, and the probe driver 553 may be driven again to separate the probe pad 558 from the target substrate SUB in the other steps. More detailed description thereon will be made below with reference to the other drawings.

The probe pad 558 may form an electric field on the target substrate SUB through electrical signals transmitted from the probe jigs 551 and 552. The probe pad 558 may be connected to the target substrate SUB to transmit the electrical signal to form an electric field on the target substrate SUB. For example, the probe pad 558 may be in contact with an electrode or a power pad of the target substrate SUB, and the electrical signal of the probe jigs 551 and 552 may be transmitted to the electrode or power pad. The electrical signal transmitted to the target substrate SUB may form an electric field on the target substrate SUB.

It is, however, to be understood that the disclosure is not limited thereto. The probe pad 558 may be a member that forms an electric field through electrical signals transmitted from the probe jigs 551 and 552. For example, in case that the probe pad 558 receives the electrical signal to form an electric field, the probe pad 558 may not be connected to the target substrate SUB.

The shape of the probe pad 558 is not particularly limited herein but in an embodiment, the probe pad 558 may have a shape extended in one direction to cover the entire target substrate SUB.

The probe jigs 551 and 552 may be connected to the probe pad 558 and may be electrically connected to a separate voltage application device. The probe jigs 551 and 552 may transmit an electric signal transmitted from the voltage application device to the probe pad 558 to form an electric field on the target substrate SUB. The electric signal transmitted to the probe jigs 551 and 552 may be a voltage for forming an electric field, for example, an AC voltage.

The probe part 550 may include probe jigs 551 and 552, and the number is not particularly limited herein. Although the two probe jigs 551 and 552 may be disposed in the example shown in the drawings, the probe part 550 may include more than two probe jigs to form an electric field having a higher density on the target substrate SUB.

The probe part 550 according to an embodiment of the disclosure is not limited thereby. Although the probe part 550 is shown as being disposed on the probe support 530, for example, the stage part 500 in the drawings, the probe part 550 may be disposed as a separate device in some implementations. The structure or arrangement of the stage part 500 is not particularly limited as long as it includes a device capable of forming an electric field so that an electric field can be formed on the target substrate SUB.

Figure 7:
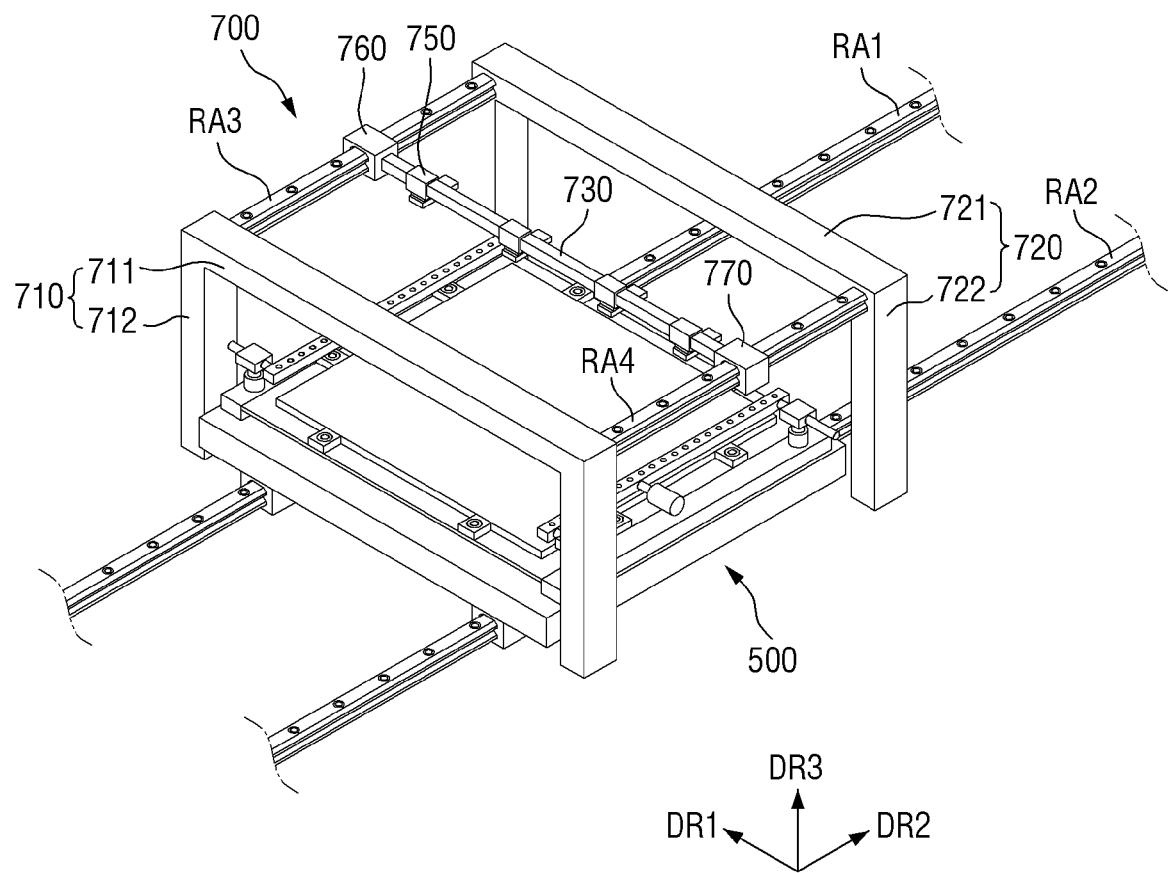
FIG. 7 is a schematic perspective view showing an inspection apparatus according to an embodiment of the disclosure.
Figure 8:
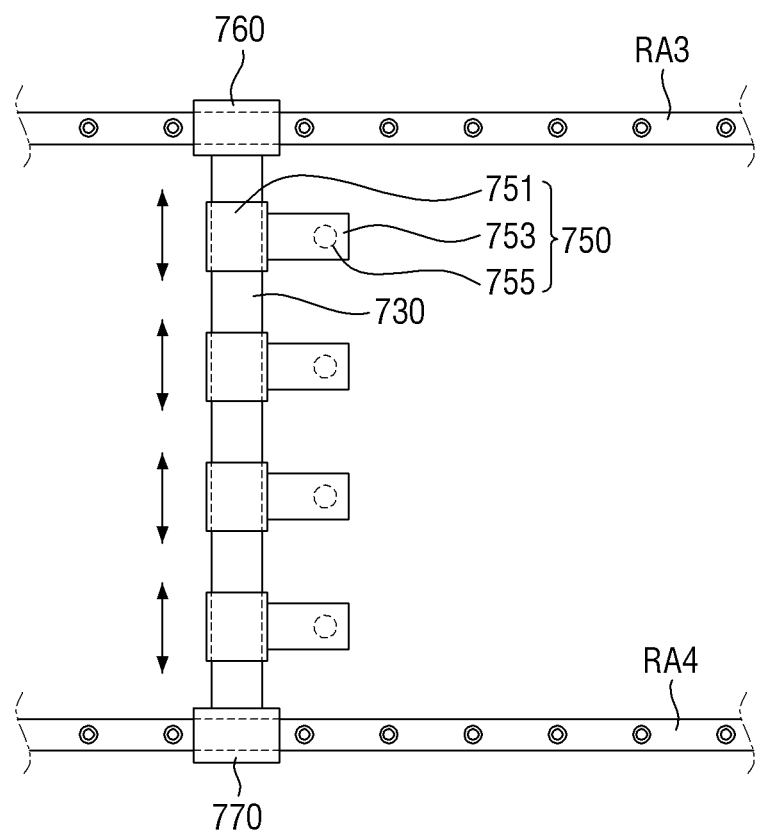
FIG. 8 is a schematic plan view showing the inspection apparatus according to an embodiment of the disclosure.

FIG. 7 is a schematic perspective view showing an inspection apparatus according to an embodiment of the disclosure. FIG. 8 is a schematic plan view showing the inspection apparatus according to an embodiment of the disclosure.

Referring to FIGS. 7 and 8, an inspection apparatus 700 may include a stage part 500. The stage part 500 of FIG. 6 has been moved to below the inspection apparatus 700 in FIG. 7. The inspection apparatus 700 may be disposed at the end of the inkjet printing apparatus 1000 and may be used after the inkjet printing process may be finished.

The inspection apparatus 700 may include a second base frame 710, a third base frame 720, and a third rail RA3 and a fourth rail RA4 connecting between the second base frame 710 and the third base frame 720.

The second base frame 710 and the third base frame 720 may include a third base 711 and a fourth base portion 721, respectively, and a third support 712 and a fourth support 722 supporting them, respectively. The second base frame 710 and the third base frame 720 may be spaced apart from each other in the second direction DR2, and the third rail RA3 and the fourth rail RA4 may be disposed therebetween. The third rail RA3 and the fourth rail RA4 may be disposed between the third base 711 and the fourth base 721 to connect between them. Both ends of each of the third rail RA3 and the fourth rail RA4 may be extended to the third base 711 and the fourth base 721 or the third support 712 and the fourth support 722, so that they may be spaced apart from each other in the first direction DR1. Like the first rail RA1 and the second rail RA2, the third and fourth rails RA3 and RA4 may be extended in the second direction DR2, and the sensing part 750 mounted on them may move in the second direction DR2. The length of the third rail RA3 and the fourth rail RA4, i.e., the distance between the second base frame 710 and the third base frame 720 is not particularly limited. For example, the area formed by the third rail RA3 and the fourth rail RA4 which may be spaced apart from each other and extended may cover the entire stage part 500. It is, however, to be understood that the disclosure is not limited thereto.

The sensing part 750 may be mounted on the third support 730. A first moving part 760 and a second moving part 770 may be mounted on the third rail RA3 and the fourth rail RA4, and the first and second moving parts 760 and 770 may be extended to the ends of the third support 730. The third support 730 may have a shape extended in the first direction DR1 in which the third rail RA3 and the fourth rail RA4 may be spaced apart from each other. The sensing part 750 may be, but is not limited to, a time delay integration (TDI) scan camera. Other types of cameras may be employed as long as a gray value can be obtained.

The first and second moving parts 760 and 770 may be mounted on the third and fourth rails RA3 and RA4 to move in the second direction DR2. As the first and second moving parts 760 and 770 move, the sensing part 750 mounted on the third support 730 and the third support 730 may move as well. For example, according to an embodiment of the disclosure, the sensing part 750 may move in the second direction DR2 and may capture an image of the target substrate SUB disposed on the stage part 500 along the second direction DR2.

The sensing part 750 may include a third moving part 751 mounted on the third support 730, a fourth support 753 disposed on the lower surface of the third moving part 751, and a first sensor 755 disposed on the fourth support 753.

The third moving part 751 of the sensing part 750 may be mounted on the third support part 730 and may move in the first direction DR1 in which the third support 730 may be extended. The fourth support 753 may be disposed on the lower surface of the third moving part 751, and at least one first sensor 755 may be disposed on the lower surface of the bottom of the fourth support 753. In the drawing, four first sensors 755 are arranged on the lower surface of four fourth supports 753 and may be spaced apart from one another. It is, however, to be understood that the disclosure is not limited thereto. More than four first sensors 755 may be disposed. In some implementations, multiple fourth supports 753 may be disposed, and only one first sensor may be disposed in one fourth support 753.

The first sensor 755 may be disposed on the lower surface of the fourth support 753 to face the target substrate SUB of the stage part 500. In an embodiment, the first sensors 755 may measure the gray value of a region of interest of the target substrate SUB. According to an embodiment of the disclosure, the gray value of the region of interest of the target substrate SUB may be calculated by the inspection apparatus 700 to measure the number of light-emitting elements DP disposed in the sub-pixels. The sensing part 750 may measure the gray value of the target substrate SUB in the first direction DR1 on the stage part 500 as the third moving part 751 moves in the first direction DR1 on the third support 730. As the first and second moving parts 760 and 770 move in the second direction DR2, the gray value of the target substrate SUB along the second direction DR2 on the stage part 500 can be measured.

Hereinafter, a method for inspecting a display device as a part of a method for fabricating a display device using the above-described inspection apparatus will be described.

Figure 9:
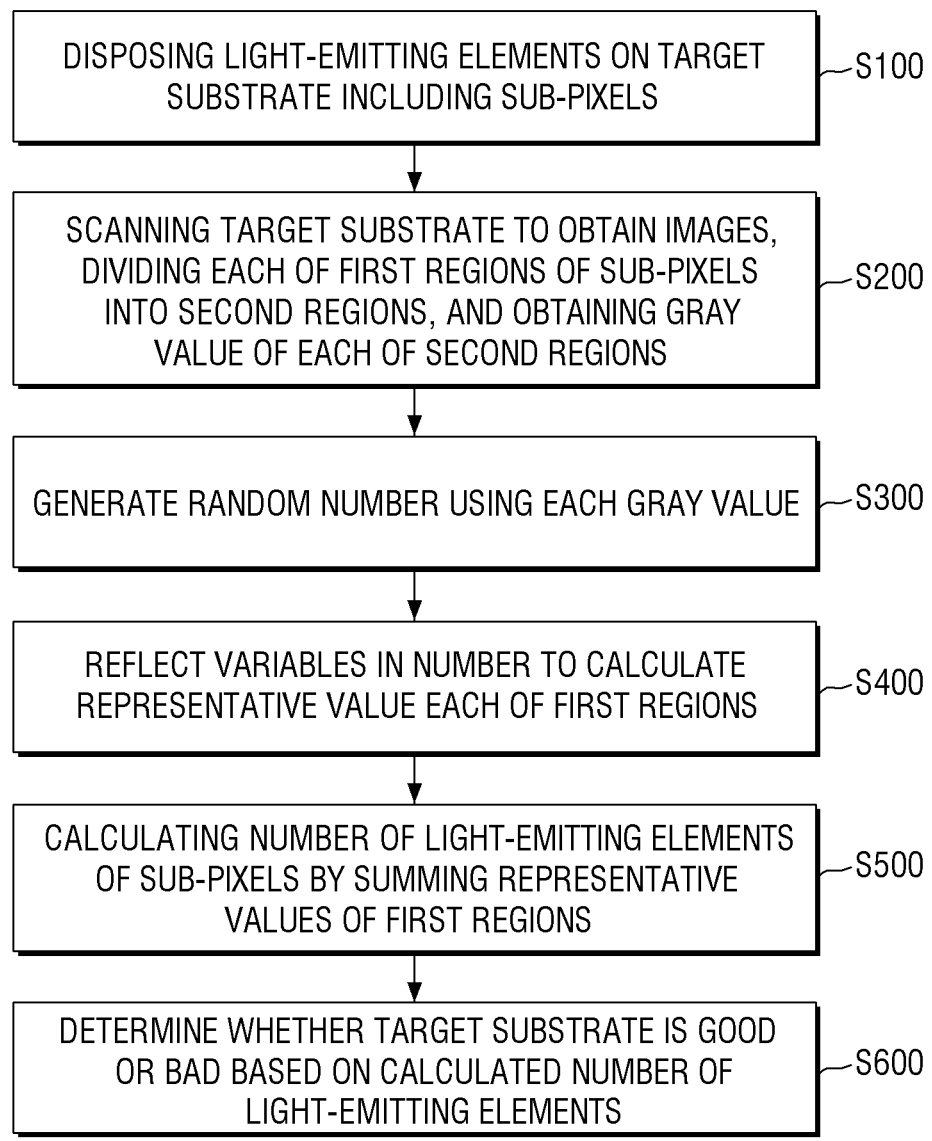
FIG. 9 is a flowchart for illustrating a method for fabricating a display device according to an embodiment of the disclosure.
Figure 10:
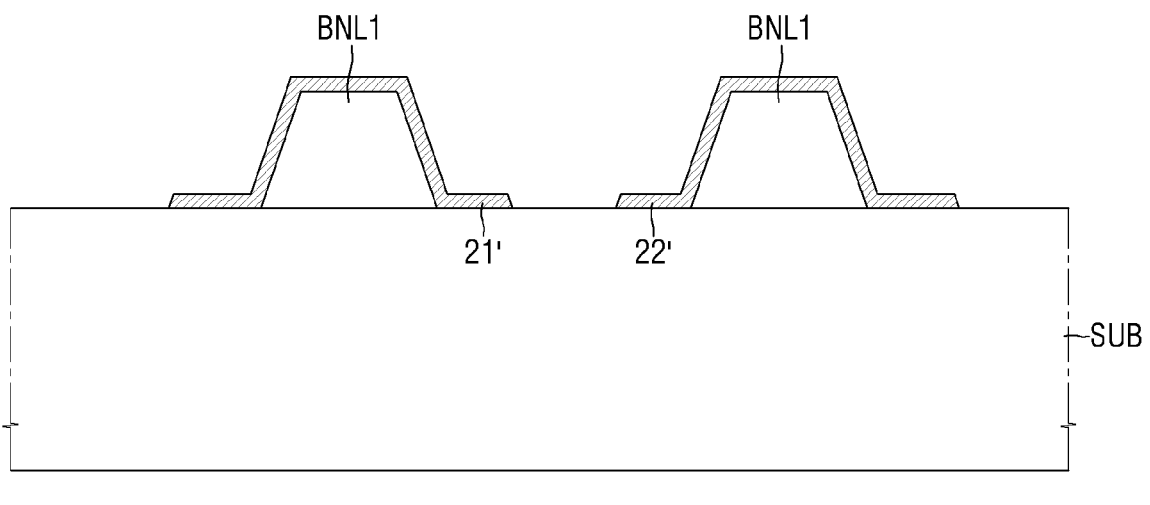
FIG. 10 is a schematic cross-sectional view showing a part of processing steps of fabricating a display device according to an embodiment of the disclosure.
Figure 11:
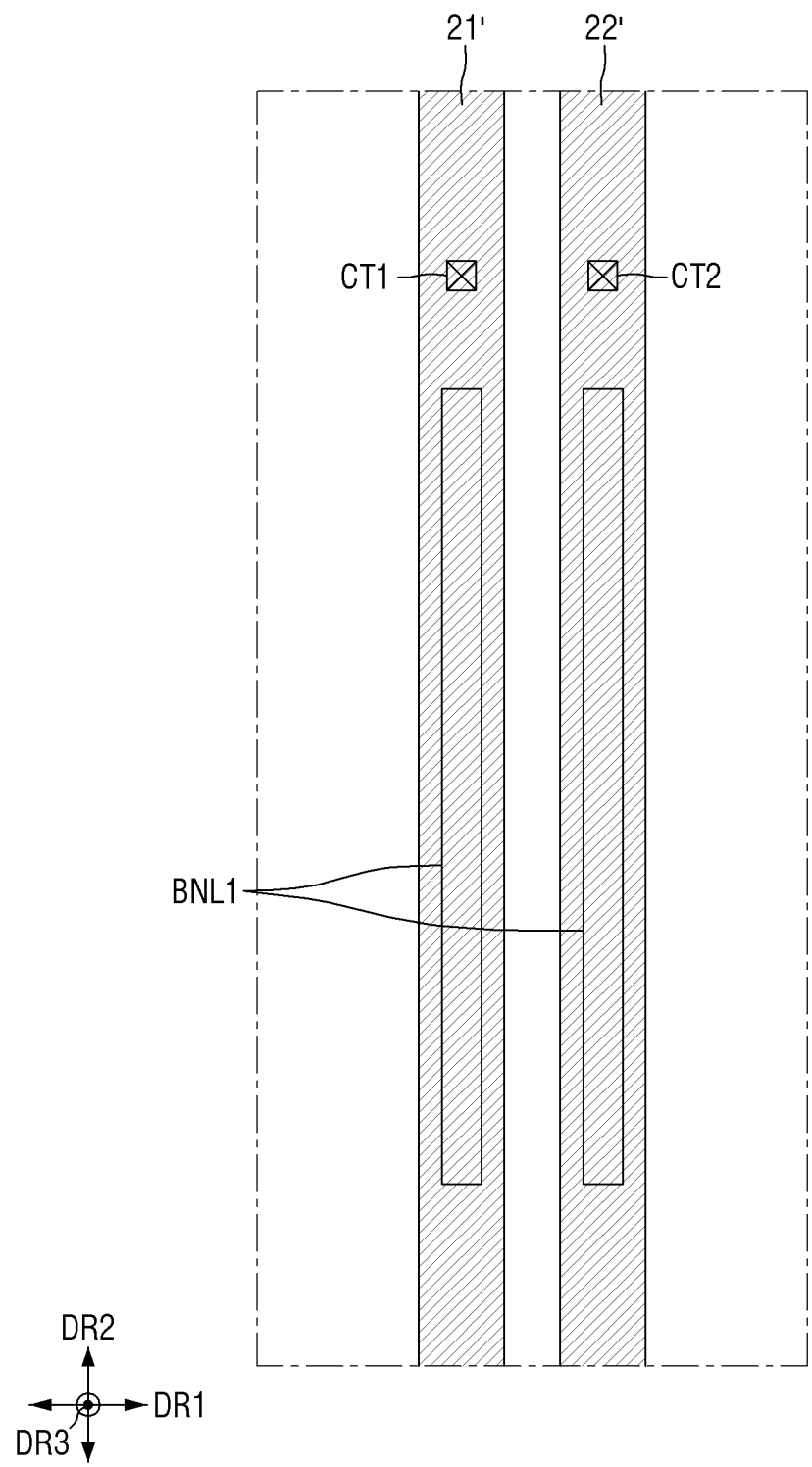
FIG. 11 is a schematic plan view showing a sub-pixel at one of the processing steps of fabricating a display device according to an embodiment of the disclosure.
Figure 13:
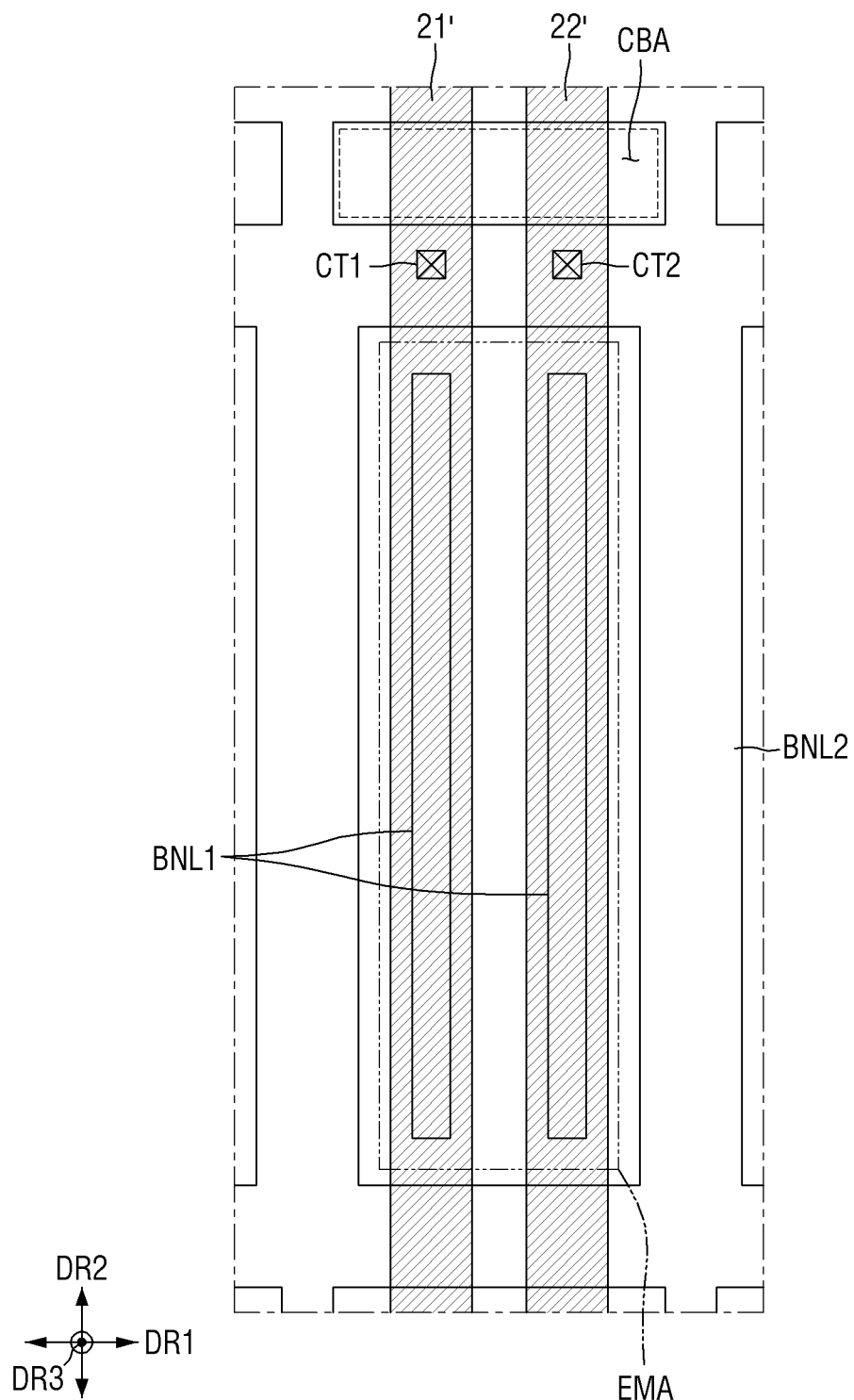
FIG. 13 is a schematic plan view showing a sub-pixel at one of the processing steps of fabricating a display device according to an embodiment of the disclosure.
Figure 14:
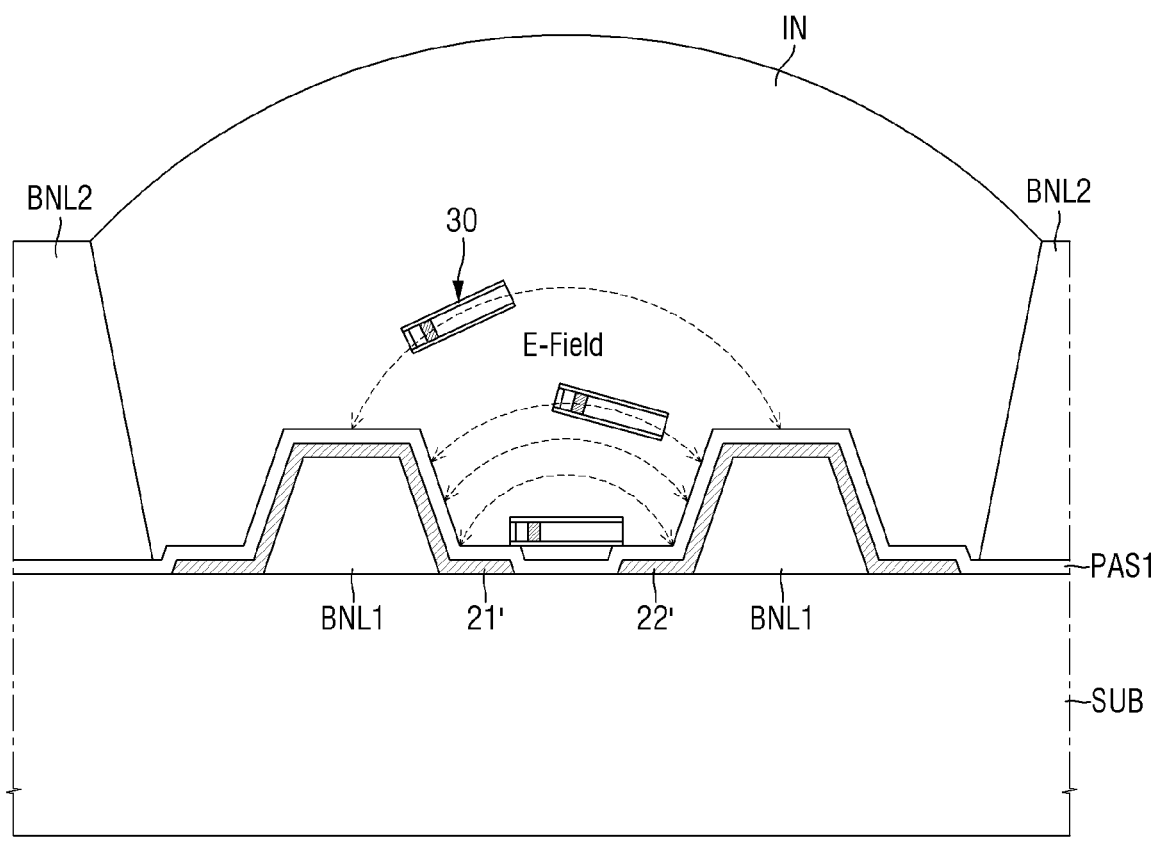
FIG. 14 is a schematic cross-sectional view showing a part of processing steps of fabricating a display device according to an embodiment of the disclosure.
Figure 15:
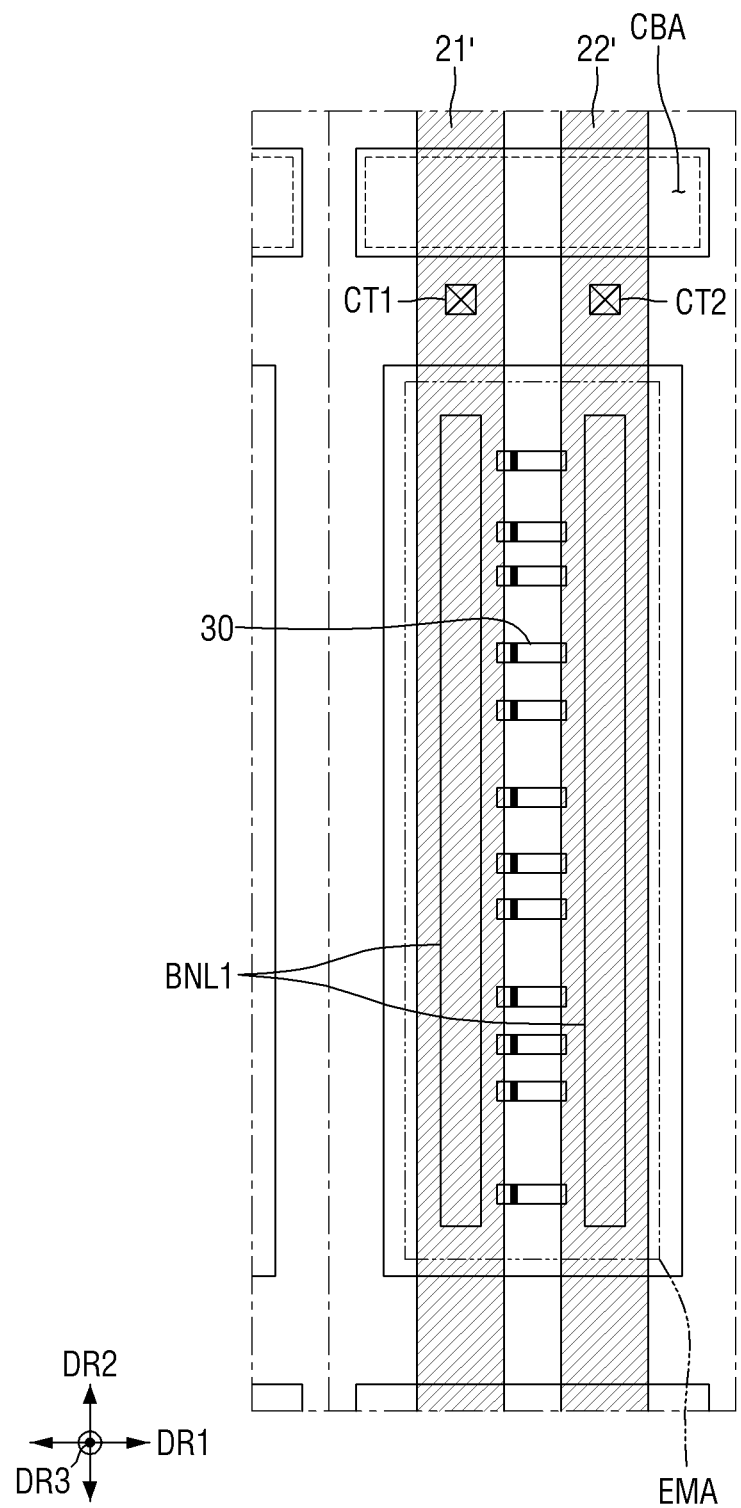
FIG. 15 is a schematic plan view showing a sub-pixel at one of the processing steps of fabricating a display device according to an embodiment of the disclosure.
Figure 16:
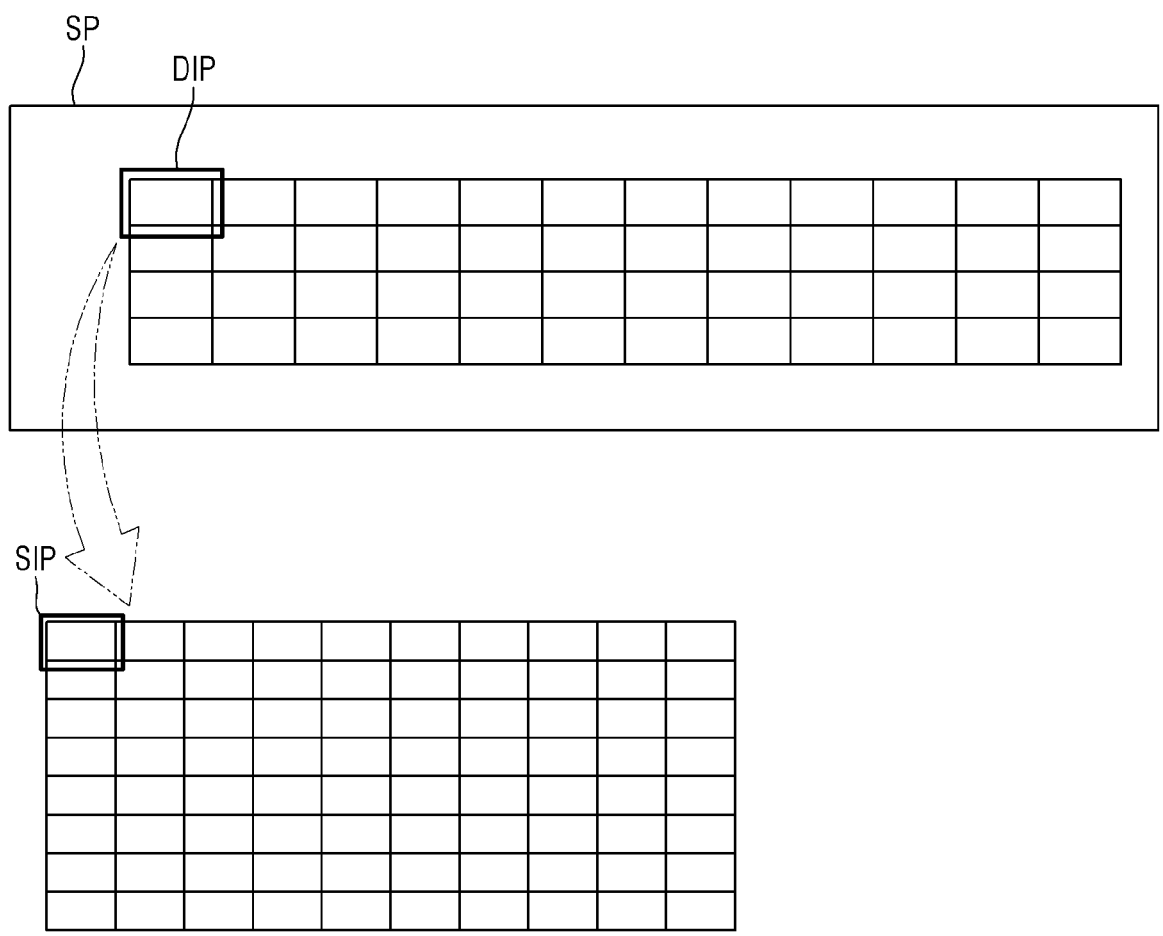
FIG. 16 is a schematic plan view showing a region of a sub-pixel measured by the inspection apparatus according to an embodiment of the disclosure.
Figure 17:
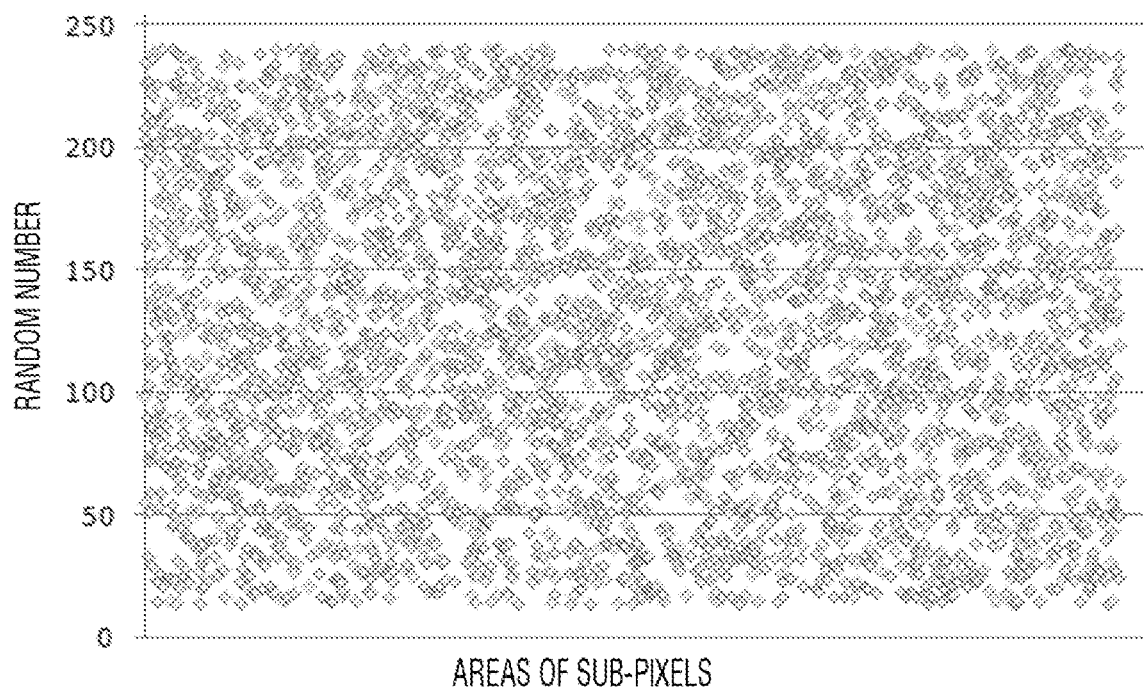
FIG. 17 is a schematic graph showing the distribution of gray values of a single sub-pixel.
Figure 18:
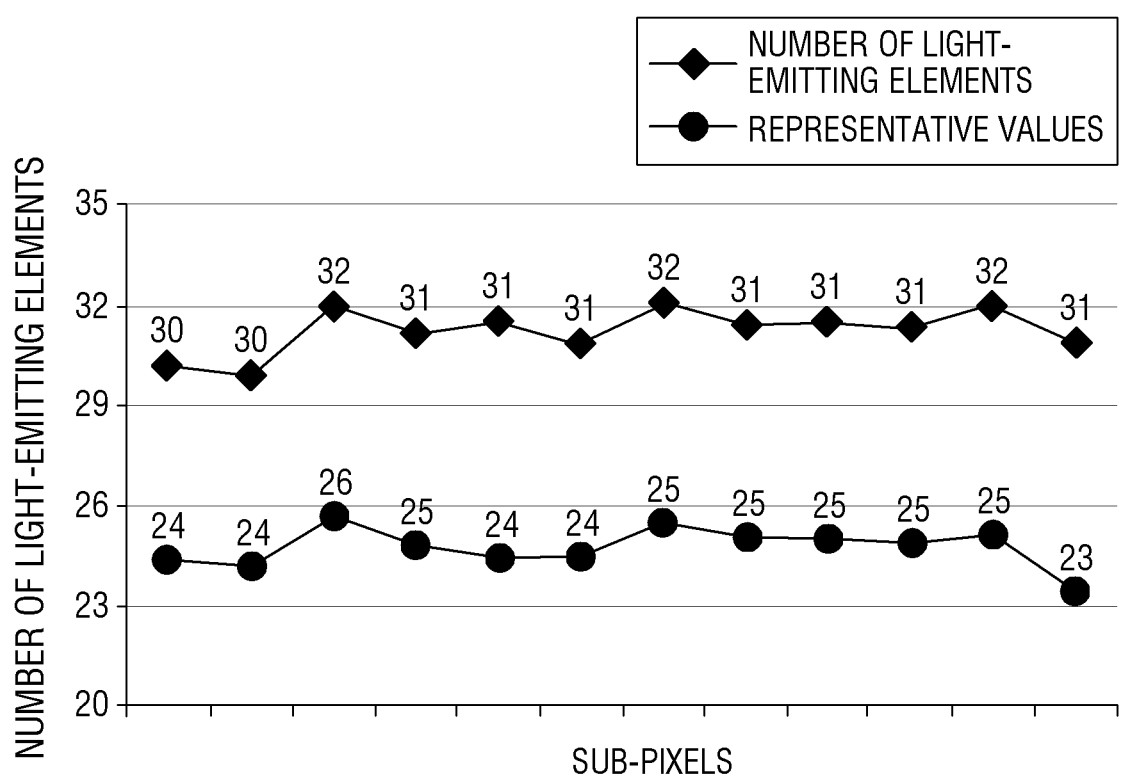
FIG. 18 is a schematic graph showing representative values and the numbers of light-emitting elements for different sub-pixels.

FIG. 9 is a flowchart for illustrating a method for fabricating a display device according to an embodiment of the disclosure. FIG. 10 is a schematic cross-sectional view showing a part of processing steps of fabricating a display device according to an embodiment of the disclosure. FIG. 11 is a schematic plan view showing a sub-pixel at one of the processing steps of fabricating a display device according to an embodiment of the disclosure. FIG. 12 is a schematic cross-sectional view showing a part of processing steps of fabricating a display device according to an embodiment of the disclosure. FIG. 13 is a schematic plan view showing a sub-pixel at one of the processing steps of fabricating a display device according to an embodiment of the disclosure. FIG. 14 is a schematic cross-sectional view showing a part of processing steps of fabricating a display device according to an embodiment of the disclosure. FIG. 15 is a schematic plan view showing a sub-pixel at one of the processing steps of fabricating a display device according to an embodiment of the disclosure. FIG. 16 is a schematic plan view showing a region of a sub-pixel measured by the inspection apparatus according to an embodiment of the disclosure. FIG. 17 is a schematic graph showing the distribution of gray values of a single sub-pixel. FIG. 18 is a schematic graph showing representative values and the numbers of light-emitting elements for different sub-pixels.

Referring to FIG. 9, a method for fabricating a display device according to an embodiment of the disclosure may include disposing light-emitting elements on a target substrate including sub-pixels (step S100); scanning the target substrate to obtain images, dividing each of the multiple first regions of the sub-pixels into multiple second regions and obtaining a gray value of each of the second regions (step S200); generating random numbers using the gray values (step S300); calculating a representative value for each of the first regions by reflecting variables in the random numbers (step S400); calculating a number of the light-emitting elements of the sub-pixels by summing representative values of the first regions (step S500); and determining whether the target substrate is acceptable (e.g., good) or unacceptable (e.g., bad) based on the calculated number of light-emitting elements (step S600). For example, the method may include comparing the number of the light-emitting elements of the sub-pixels with a reference value, and determining a condition of the target substrate (e.g., acceptable) based on a result of the comparing.

Referring to FIGS. 9 and 10, a target substrate SUB may be prepared. Although not shown in the drawings, the target substrate SUB may include the above-described substrate 11, and may include sub-pixels SP including circuit elements consisting of conductive layers and insulating layers. In the following description, the target substrate SUB including the substrate and sub-pixels will be described for convenience of illustration.

Subsequently, first banks BNL1 spaced apart from one another may be formed on the target substrate SUB. The first banks BNL1 may have a shape protruding from the upper surface of the target substrate SUB. The description thereon has already been given above.

Subsequently, referring to FIGS. 10 and 11, a first electrode layer 21' and a second electrode layer 22' disposed on the first banks BNL1 may be formed. The first electrode layer 21' and the second electrode layer 22' may be extended in the second direction DR2 and may be spaced apart from each other with respect to a pattern. The first electrode layer 21' and the second electrode layer 22' may be extended in the second direction DR2 during the processing steps of fabricating the display device 10 and may be disposed in other sub-pixels PXn. After the light-emitting elements 30 may be disposed during a subsequent process, the first electrode layer 21' and the second electrode layer 22' may be separated at the cut area CBA of each of the sub-pixels PXn, so that the first electrode 21 and the second electrode 22 can be formed.

Subsequently, referring to FIGS. 12 and 13, a first insulating material layer PAS1 covering the first electrode layer 21' and the second electrode layer 22' may be formed. The second bank BNL2 may be formed which may be disposed on the first insulating layer PAS1 and surrounds the emission area EMA and the cut area CBA of each of the sub-pixels PXn. The first insulating material layer PAS1 may be disposed on the entire target substrate SUB and may cover the electrode layers 21' and 22'. The first insulating material layer PAS1 may be partially removed during a subsequent process to expose the upper surfaces of the electrode layers 21' and 22', so that the first insulating layer PAS1 may be formed. The second bank BNL2 may be disposed to surround each of the sub-pixels PXn to distinguish them from one another, and also to distinguish the emission area EMA from the cut area CBA.

Subsequently, referring to FIGS. 14 and 15, light-emitting elements 30 may be disposed between the first banks BNL1. The light-emitting elements 30 may be disposed on the first insulating material layer PAS1 so that the ends may be disposed on the first electrode layer 21' and the second electrode layer 22', respectively. The light-emitting elements 30 may be dispersed in an ink IN and may be sprayed onto the target substrate SUB. In an embodiment, the light-emitting elements 30 may be prepared as they may be dispersed in an ink IN containing a solvent and may be sprayed onto the target substrate SUB via a printing process using the above-described inkjet printing apparatus. The ink sprayed from the inkjet printing apparatus may be settled in the area surrounded by the second bank BNL2. The second bank BNL2 can prevent the ink IN from overflowing to other neighboring sub-pixels PXn.

Subsequently, in case that the ink IN including the light-emitting element 30 may be sprayed, an electrical signal may be applied to the electrode layers 21' and 22' so that light-emitting elements 30 may be disposed on the first insulating material layer PAS1.

Specifically, in case that an electric signal, i.e., an electric current flows to the electrode layers 21' and 22', an electric field E-Field may be generated over the electrode layers 21' and 22'. The light-emitting elements 30 dispersed in the ink IN may generate a dipole moment in case that an AC signal may be applied to one of the electrode layers 21' and 22'. In the light-emitting elements 30 in which the dipole moment may be generated, a rotation torque TDEP may be generated in response to the generated electric field, so that the light-emitting elements 30 may be aligned. The light-emitting elements 30 may be subjected to a dielectric force (FDEP) by a first electric field, and the light-emitting elements 30 that may be subjected to the dielectrophoretic force may move toward a greater electric field. Both ends thereof may be seated on the electrode layers 21' and 22'.

As shown in FIG. 15, an end of each of the light-emitting elements 30 dispersed in the ink may be seated on the first electrode layer 21' while another end thereof may be seated on the second electrode 22'. The solvent may be removed from the ink IN sprayed on the target substrate SUB, and the positions of the light-emitting elements 30 may be fixed.

A method for inspecting a display device by checking the number of light-emitting elements 30 formed in the sub-pixels may be carried out on the target substrate SUB on which the light-emitting elements 30 may be formed.

Referring back to FIG. 9, a method for inspecting a display device according to an embodiment of the disclosure may include scanning the target substrate to obtain images, dividing each of the multiple first regions of the sub-pixels into multiple second regions and obtaining a gray value of each of the second regions (step S200); generating random numbers using the gray values (step S300); calculating a representative value for each of the first regions by reflecting variables in the random numbers (step S400); calculating a number of the light-emitting elements of the sub-pixels by summing representative values of the first regions (step S500); and determining whether the target substrate may be acceptable or unacceptable based on the calculated number of light-emitting elements (step S600).

Initially, the scanning of the target substrate to obtain images, dividing each of the multiple first regions of the sub-pixels into multiple second regions and obtaining a gray value of each of the second regions (step S200) may be carried out as described below.

The target substrate SUB on which the light-emitting elements 30 may be disposed may be mounted on the stage part 500 of the inspection apparatus 700 shown in FIGS. 7 and 8 described above. The sensor part 750 may scan the target substrate to obtain images. The sensor part 750 may reciprocate in a direction that crosses and may be perpendicular to the direction in which the target substrate SUB may be moved. In some embodiments, the sensor part 750 may move along the direction in which the target substrate SUB may be moved. Accordingly, the sensor part 750 may obtain images on the entire target substrate SUB by sensing it.

The obtained images on the entire target substrate SUB may be converted into a single image on the entire target substrate SUB by template matching. Since the sensor part 750 divides and senses the entire areas of the target substrate SUB, images may be divided for each area. In order to clearly check the areas of the target substrate SUB, it may be necessary to integrate the divided images so that they may be associated with the respective areas of the target substrate SUB. Template matching may refer to a process of integrating images on the sub-pixels into a sing image based on certain areas of the sub-pixels of the target substrate SUB in comparison with the image on the target substrate SUB as a sample.

In case that the entire area of the target substrate SUB may be converted into a single image, some of the images on the sub-pixels of the target substrate SUB may be selected as samples. As a large number of sub-pixels may be disposed on the target substrate SUB, some sub-pixels may be selected as samples to have representativeness.

As shown in FIG. 16, images on the sub-pixels SP selected as the samples may be divided into multiple first regions DIP. The first regions DIP may be images on the areas in which the light-emitting elements 30 may be disposed in the image on the sub-pixel SP. The first regions DIP may be arranged in rows and columns. According to an embodiment of the disclosure, the first regions DIP may be partitioned into a 12-by-4 matrix. It is, however, to be understood that the disclosure is not limited thereto. The first regions DIP may be arranged in a variety of matrix structures depending on the shape of the areas where the light-emitting elements may be disposed.

Each of the multiple first regions DIP may be divided into multiple second regions SIP. The second regions SIP may be partitioned in order to obtain gray values of images that may be further divided than the images of the first region DIP. The second regions SIP may be arranged in rows and columns. According to an embodiment of the disclosure, the second regions SIP may be partitioned into a 10-by-8 matrix. It is, however, to be understood that the disclosure is not limited thereto. The second regions SIP may be formed in a variety of matrix structures. A gray value may be extracted from the image associated with each of the second regions SIP. By extracting the gray value from each of the second regions SIP, it may be possible to impart reliability to the gray values of the first region DIP.

Subsequently, referring to FIG. 9, random numbers may be generated using extracted gray values (step S300). The random numbers may be generated by using a Monte-carlo simulation with a minimum value and a maximum value of the gray values of the second regions SIP. The random numbers may be generated as random values between the minimum value and the minimum value of the gray values of the second regions SIP. The random numbers thus generated may be distributed across the entire region of the sub-pixels, as shown in FIG. 17.

Because the Monte-carlo simulation generates random numbers within a range, it can reduce an error rate compared to a method using the average value of the gray values of the second regions SIP. Since the light-emitting elements 30 may be randomly disposed within the sub-pixels, there may be a number of noises which may occur due to light scattering, the positions of the light-emitting elements 30, and so on. According to an embodiment of the disclosure, it may be possible to reduce noise by using the Monte-carlo simulation.

Subsequently, referring to FIG. 9, representative values of each of the first regions may be calculated by reflecting variables in the generated random numbers (step S400). As described above, since the light-emitting elements 30 may be randomly arranged within the sub-pixels, there may be a variety of variables in the gray values depending on the positions of the light-emitting elements 30, etc. Therefore, according to an embodiment, the representative values may be calculated by reflecting these variables in the generated random numbers.

The variables may be gray values, micro X values, micro Y values, global X values, and global Y values. The micro X values may refer to x-coordinates of the location of the first region DIP where the gray value may be obtained among sub-pixels. The micro Y values may refer to y-coordinates of the location of the first region DIP where the gray value may be obtained among sub-pixels. The global X values may refer to x-coordinates of the location of the first region DIP where the gray value may be obtained on the target substrate SUB. The global Y values may refer to y-coordinates of the location of the first region DIP where the gray value may be obtained on the target substrate SUB.

These variables may be reflected in the representative values by increasing or decreasing the values of the random numbers. Specifically, the gray values, the micro X values and the global X values may decrease the values of the random numbers, whereas the micro Y values and the global Y values may increase the values of the random numbers. These variables may correct the values by a variety of variables by decreasing or increasing the values of the random numbers to calculate the representative values.

Subsequently, referring to FIGS. 9 and 18, it may be possible to calculate the number of the light-emitting elements 30 of the sub-pixels by summing the representative values of the respective first regions DIP. Once the representative values of the respective first regions DIP may be calculated, they may be associated with the number of the light-emitting elements 30.

According to an embodiment, a table may be stored, in which the numbers of light-emitting elements 30 may be associated with the representative values of the first regions DIP, respectively. The data in this table may be accumulated by repeating tasks of matching the actual numbers of the light-emitting elements 30 with the representative values by checking the number of the light-emitting elements 30 of the first regions DIP of the target substrate SUB by eyes when the random numbers of the gray values for the images on the first regions DIP may be generated and the representative values may be calculated based on the random numbers.

According to an embodiment of the disclosure, as shown in FIG. 18, if the representative value is 24, the number of light-emitting elements may be 30, if the representative value is 25, the number of light-emitting elements may be 31 or 32, and if the representative value is 26, the number of light-emitting elements may be 32. Once the representative values of the respective first regions DIP may be calculated using the table, they may be associated with the numbers of the light-emitting elements 30, respectively, so that the numbers of the light-emitting elements 30 can be calculated using the inspection apparatus 700. The numbers of the light-emitting elements 30 calculated from the representative values for the first regions DIP may be summed, so that the number of the light-emitting elements 30 disposed in a single sub-pixel can be calculated.

Subsequently, referring to FIG. 9, it may be possible to determine whether the target substrate SUB is acceptable or unacceptable based on the calculated number of light-emitting elements 30. If the number of light-emitting elements 30 disposed in each of the sub-pixels selected as the samples is equal to or greater than a reference value, it may be determined that the target substrate SUB is acceptable and it may be transferred to a subsequent process. On the other hand, if the number of light-emitting elements 30 disposed in each of the sub-pixels selected as the samples is less than the reference value, it may be determined that the target substrate SUB is unacceptable and it may be transferred to a repair process or may be discarded.

As described above, the method for inspecting the display device according to an embodiment of the disclosure can reduce the process tact time by calculating the number of light-emitting elements by calculating the representative values based on the images on the target substrate. In case that an inspector examines by her/his eyes the number of light-emitting elements of 200 points of a target substrate for producing an 18.2-inch standard display device, it may take approximately 3,600 seconds. On the other hand, in case that the number of light-emitting elements in the entire area is checked by using an inspection apparatus having three sensor parts, it may take approximately 60 seconds. As a result, the inspection tack time may be significantly reduced.

Incidentally, after the target substrate SUB has been inspected, it may be input to the process of fabricating the display device.

As described above with reference to FIGS. 2 and 3, a portion of the first insulating material layer PAS1 may be removed so that the upper surfaces of the first electrode layer 21' and the second electrode layer 22' may be exposed, thereby forming the first insulating layer PAS1. The first insulating layer PAS1 may include an opening OP exposing a portion of the electrode layers 21' and 22'. The upper surfaces of the electrode layers 21' and 22' exposed through the openings OP may be in contact with the contact electrodes CNE1 and CNE2.

Subsequently, a process of cutting parts of the first electrode layer 21' and the second electrode layer 22' disposed in the cut area CBA may be carried out, to form the first electrode 21 and the second electrode 22. Subsequently, the first contact electrode CNE1 and the second contact electrode CNE2 may be formed on the target substrate SUB so that the ends of each of the light-emitting elements 30 may be in contact with them, respectively. The third insulating layer PAS3 and the fourth insulating layer PAS4 may be on the first contact electrode CNE1 and the second contact electrode CNE2, so that the display device 10 can be produced.

In concluding the detailed description, those skilled in the art will appreciate that many variations and modifications can be made to the embodiments without substantially departing from the principles of the invention. Therefore, the disclosed embodiments of the invention are used in a generic and descriptive sense only and not for purposes of limitation.

What is claimed is:

1. A method for inspecting a display device, the method comprising:
   preparing a target substrate comprising sub-pixels, which includes disposing light-emitting elements on the target substrate, wherein disposing includes
   forming a first electrode layer and a second electrode layer on the target substrate;
   spraying an ink containing the light-emitting elements dispersed in a solvent onto the target substrate; and
   generating an electric field over the target substrate to align the light-emitting elements;
   dividing each of a plurality of first regions of the sub-pixels into a plurality of second regions;
   obtaining a gray value of each of the plurality of second regions;
   generating a random number using the gray value;
   calculating a representative value of each of the plurality of first regions by reflecting variables in the random number;
   summing the representative values of the plurality of first regions to calculate a number of light-emitting elements of the sub-pixels; and
   if the number of light-emitting elements of the sub-pixels more than a predetermined value, performing subsequent processing on the display device.

2. The method of claim 1, wherein the obtaining of the gray value comprises obtaining images by scanning an entire area of the target substrate using an inspection apparatus comprising a sensing part.

3. The method of claim 2, wherein the entire area of the target substrate is converted into a single image by template matching.

4. The method of claim 1, wherein the generating of the random number comprises generating the random number using a Monte-Carlo simulation of a minimum value and a maximum value of the gray value of each of the plurality of second regions.

5. The method for claim 4, wherein the random number is a value between the minimum value and the maximum value that is selected randomly.

6. The method of claim 1, wherein the variables are at least one of a gray value, a micro X value, a micro Y value, a global X value, and a global Y value.

7. The method of claim 6, wherein
   the micro X value is a x-coordinate of a location of the first region in the respective sub-pixel where the gray value is obtained, and
   the micro Y value is a y-coordinate of the location of the first region in the respective sub-pixel where the gray value is obtained.

8. The method of claim 7, wherein
   the global X value is a x-coordinate of a location of the first region in the target substrate where the gray value is obtained, and
   the global Y value is a y-coordinate of the location of the first region in the target substrate where the gray value is obtained.

9. The method of claim 8, wherein
   the gray value, the micro X value and the global X value decrease a value of the random number, and
   the micro Y value and the global Y value increase the value of the random number.

10. The method of claim 1, wherein the representative value of each of the plurality of first regions is associated with a respective number of light-emitting elements.

11. The method of claim 10, wherein the number of light-emitting elements disposed in the plurality of first regions of the sub-pixels is calculated by summing the representative values of the respective first regions.

12. The method for claim 1, wherein the gray value of each of the plurality of second regions is obtained by measuring the target substrate using an inspection apparatus equipped with a sensor device.

13. The method for claim 12, wherein the sensor device is a time delay integration TDI scan camera.

14. The method of claim 1, further comprising:
   comparing the number of the light-emitting elements of the sub-pixels with a reference value; and
   determining a condition of the target substrate based on a result of the comparing.

15. A method for fabricating a display device, the method comprising:
   disposing light-emitting elements on a target substrate comprising sub-pixels, wherein disposing includes
   forming a first electrode layer and a second electrode layer on the target substrate;
   spraying an ink containing the light-emitting elements dispersed in a solvent onto the target substrate; and
   generating an electric field over the target substrate to align the light-emitting elements;
   scanning the target substrate with an inspection apparatus comprising a sensor part to obtain images;
   dividing each of a plurality of first regions of the sub-pixels into a plurality of second regions;
   obtaining a gray value of each of the plurality of second regions;

generating a random number using the gray value;

calculating a representative value for each of the plurality of first regions by reflecting variables in the random number;

calculating a number of the light-emitting elements of the sub-pixels by summing representative values of the plurality of first regions;

determining a condition of the target substrate based on the number of light-emitting elements of the sub-pixels;

forming a first insulating layer on the target substrate; and forming a first contact electrode and a second contact electrode in contact with the light-emitting elements, wherein if the condition of the target substrate is acceptable, perform subsequent processing on the display device.

16. The method of claim 15, wherein the scanning of the target substrate comprises inspecting the target substrate after the spraying of the ink, wherein the inspection apparatus is disposed at an end of an inkjet printing apparatus.

17. The method of claim 15, wherein
the inspection apparatus comprises rails to which the sensing part is coupled, and
the sensing part reciprocates through the rails to scan the target substrate.

18. The method of claim 15, wherein
the generating of the random number comprises generating the random number using a Monte-Carlo simulation of a minimum value and a maximum value of the gray value of each of the plurality of second regions, and
the random number is a value between the minimum value and the maximum value that is selected randomly.

19. The method of claim 15, wherein
the variables are a gray value, a micro X value, a micro Y value, a global X value and a global Y value,
the gray value, the micro X value and the global X value decrease a value of the random number, and
the micro Y value and the global Y value increase the value of the random number.

* * * * *